United States Patent
Lee

(10) Patent No.: US 7,177,190 B2
(45) Date of Patent: Feb. 13, 2007

(54) COMBINATION NONVOLATILE INTEGRATED MEMORY SYSTEM USING A UNIVERSAL TECHNOLOGY MOST SUITABLE FOR HIGH-DENSITY, HIGH-FLEXIBILITY AND HIGH-SECURITY SIM-CARD, SMART-CARD AND E-PASSPORT APPLICATIONS

(75) Inventor: Peter W. Lee, Saratoga, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 22 days.

(21) Appl. No.: 11/025,822

(22) Filed: Dec. 24, 2004

(65) Prior Publication Data

US 2006/0114719 A1 Jun. 1, 2006

Related U.S. Application Data

(60) Provisional application No. 60/631,197, filed on Nov. 26, 2004.

(51) Int. Cl.
*G11C 11/34* (2006.01)
(52) U.S. Cl. .............. 365/185.17; 365/185.29
(58) Field of Classification Search .......... 365/185.17, 365/185.29
See application file for complete search history.

(56) References Cited

U.S. PATENT DOCUMENTS 5,877,524 A * 3/1999 Oonakado et al. .......... 257/321
5,986,935 A * 11/1999 Iyama et al. ............ 365/185.18
6,108,236 A * 8/2000 Barnett .................. 365/185.09
6,801,458 B2 10/2004 Sakui et al. ........... 365/185.24
2002/0186591 A1* 12/2002 Lee et al. .............. 365/185.17

OTHER PUBLICATIONS

Co-pending U.S. Appl. No. AP-02-007, filed Aug. 19, 2002, U.S. Appl. No. 10/223,208, assigned to the same assignee.
Co-pending U.S. Appl. No. AP-02-008, filed Jan. 24, 2003, U.S. Appl. No. 10/351,180, assigned to the same assignee.
Co-pending U.S. Appl. No. AP-02-009, filed Jan. 24, 2003, U.S. Appl. No. 10/351,179, assigned to the same assignee.

* cited by examiner

*Primary Examiner*—Michael Tran
(74) *Attorney, Agent, or Firm*—Saile Ackerman LLC; Stehpen B. Ackerman; Billy Knowles

(57) ABSTRACT

A combination EEPROM, NOR-type Flash and NAND-type Flash nonvolatile memory contains memory cells in which a floating gate transistor forms a NAND-type Flash nonvolatile memory cell, forms a NOR-type Flash nonvolatile memory cells and with one or two select transistors forms a two and three transistor EEPROM cell. The nonvolatile memory cells use a large positive programming voltage (+18V) applied to the word lines or select gating lines for programming the memory cells and a large negative erasing voltage (−18V) applied to the word lines or select gating lines for erasing the memory cells. The NOR-type Flash nonvolatile memory array is used to store code of embedded processor programs or application programs for smart cards. The EEPROM array is preferably used to store byte alterable data and NAND-type Flash nonvolatile memory array is used to store personalized biometric data such as Iris, DNA, facial picture and finger prints.

26 Claims, 14 Drawing Sheets

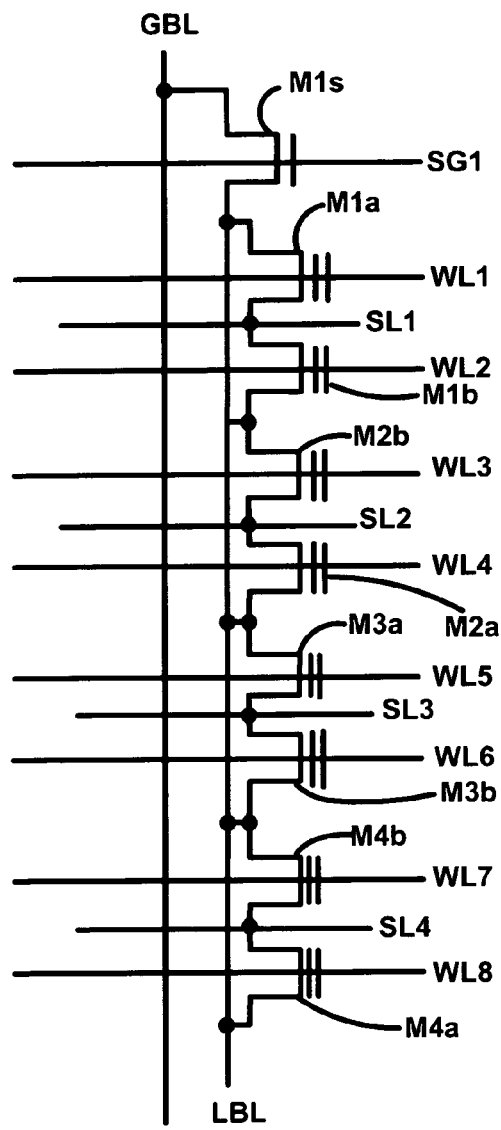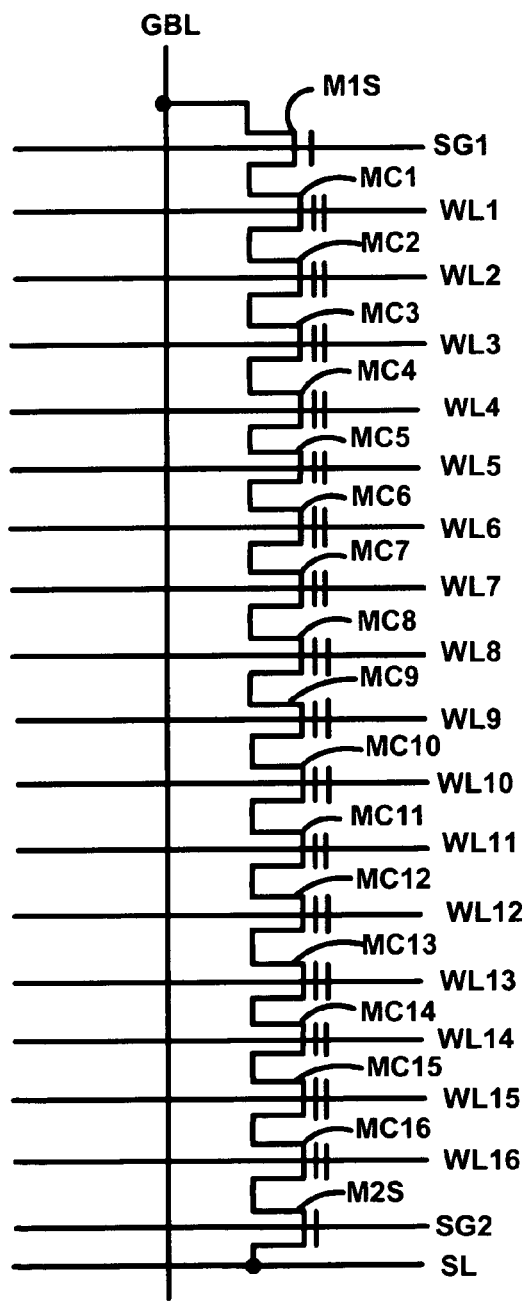
Fig. 2a
Fig. 2b ific to U.S. Provisional Patent
COMBINATION NONVOLATILE INTEGRATED MEMORY SYSTEM USING A UNIVERSAL TECHNOLOGY MOST SUITABLE FOR HIGH-DENSITY, HIGH-FLEXIBILITY AND HIGH-SECURITY SIM-CARD, SMART-CARD AND E-PASSPORT APPLICATIONS This application claims priority to U.S. Provisional Patent Application No. 60/631,197, filed Nov. 26, 2004, and herein incorporated by reference in its entirety.

RELATED PATENT APPLICATIONS

"A Novel Monolithic, Combination Nonvolatile Memory Allowing Byte, Page a Cell Array Using a Unified Cell Structure and Technology with a New Scheme of Decoder and Layout", U.S. patent application Ser. No. 10/223,208, filed Aug. 19, 2002, assigned to the same assignee as the present invention, and herein incorporated by reference.

"A Novel Monolithic, Combination Nonvolatile Memory Allowing Byte, Page and Block Write with No Disturb and Divided-Well in the Cell Array Using a Unified Cell Structure and Technology with a New Scheme of Decoder and Layout", U.S. patent application Ser. No. 10/351,180, filed Jan. 24, 2003, assigned to the same assignee as the present invention, and herein incorporated by reference.

"A Combination Nonvolatile Memory Using Unified technology with Byte, Page and Block Write and Simultaneous Read and Write Operations", U.S. patent application Ser. No. 10/351,179, filed Jan. 24, 2003, assigned to the same assignee as the present invention, and herein incorporated by reference

BACKGROUND OF THE INVENTION

1. Field of the Invention

This invention relates generally to a non-volatile integrated circuit memory. More particularly this invention relates to NAND flash electrically erasable programmable read only memory (flash memory), NOR flash memory, and electrically erasable programmable read only memory (EEPROM). Even more particularly this invention relates to incorporation of NAND flash memory, NOR flash memory, and EEPROM on one substrate for incorporation with a system-on-a-chip structure (SOC).

2. Description of Related Art

The cell structure and application of the floating gate nonvolatile memories is well known in the art. The floating gate nonvolatile memory has three classifications the Electrically Programmable Read Only Memory (EPROM), Erasable and Programmable Read Only Memory (EEPROM), and the flash Electrically Erasable and Programmable Read Only Memory (Flash). The EPROM is programmed by electrically forcing charge to the floating gate. Ultraviolet light is employed to eliminate (erase) the electrical charges of the programming from the floating gate of the EPROM. During EPROM program operation, in addition to a low-voltage power supply (VDD), an external high-voltage programming power supply (VPP) of about 12V is used. With a sealed package, UV-light cannot reach floating-gate, thus the erase operation is blocked and the EPROM is considered a One Time Programmable (OTP) EPROM. If the sealed OTP is changed to sealed Flash, then both erase and program operations can be performed electrically and repeatedly in system without the overheads of UV-light exposure and the external VPP programmer due to Flash's on-chip charge pump that can generate high voltage internally.

The sealed Flash is now able to be programmed and erased number times by using the external high-voltage power supplies to eliminate the on-chip charge pumps and state-machine without UV-light exposure to achieve numerous program and erase cycles. In this method, the die size can be drastically reduced for cost reduction. The prior art of EEPROM and the Flash memories are structurally different at the individual cell as well as in technologies, array organizations and write schemes and conditions. In prior art, 1-transistor NOR-type Flash, the drains of the cells within a block are connected in parallel to bit lines in cell array to achieve faster read speed. The erase block size is large ranging from 8 KB (64 Kb) to 64 KB (512 Kb) due to the limitation of erase operating voltage condition. The erase voltages have the memory cell's gate set to a voltage of approximately −10V and memory cell's P-Well set to approximately +10V. Having to set the P-Well to approximately +10V forces a requirement that the size of the sub-array or block of memory to be erased to be large to minimize the impact of the size constraints of a P-Well. Due to this operating voltage limitation, currently there is no page erase in unit of single word line size offered with acceptable endurance cycles of more than 100K in market. In the prior art, 1-transistor, NAND-type Flash memory, the drains and sources of cells are connected in series with a disadvantage of slower read speed but an advantage of most compact cell array. Like 1-transistor, NOR Flash, the cells are formed on P-well within deep N-well on top of P-substrate. The erase operation is performed by coupling the gate of the memory cell to the ground reference voltage (0V) and coupling the P-Well to a voltage source of approximately +20V. Having to apply the power supply to P-Well for each memory cell to be erased forces the erase size to be relatively large. The Erase size of the NOR flash memory cannot be performed in a unit of single word line. In prior art, typical 2-transistor EEPROM cell has cell scalability issue and stays at 0.25 μm.

The three nonvolatile memory technologies (EEPROM, NOR-type and NAND-type flash memory) of prior art are process incompatible and were never intended to be manufactured on a single integrated circuit chip. The EEPROM, NOR-type and NAND-type flash memory have the charge transferred to the floating gate for programming by either a channel hot injection (CHE) of the charge or by Fowler-Nordheim Tunneling (FN) through a tunneling oxide. The erasure of the EEPROM and Flash memory is generally by a Fowler-Nordheim Tunneling through the tunneling oxide.

Presently, the key primary applications nonvolatile memory systems and technologies are smart-cards. A smart card is a tiny secure computer processor embedded within a credit card-sized card. Smart cards presently are designed to comply with ISO/IEC 7816, 14443, and 15693 series of standards that define the physical shape of the smart card, the positions and shapes of its electrical connectors (if any), the communications protocols and power voltages to be applied to those connectors, the functionality, and the format of the commands sent to the card and the response returned by the card. Some smart cards may have physical connectors and other structures may have no external connections and communicate by way of radio frequency identification (RFID). Further, the compact nature of the smart card leads to the desirability for the processor, memory function, and support functions to be placed on a single chip.

The smart card is employed in such applications Subscriber Identity Module (SIM-card) and Electronic Passport (e-passport to store personalized biometric data such as DNA, finger-print, iris and facial picture), to store data of multiple applications and Biometric Information Authentication System (BIAS) programs and to store small data such as telephone numbers and short email messages in same chip. Historically, the permanent program memory such as Basic Input/Output System (BIOS) and applications for the microprocessor was formed of classic mask programmable read only memory (ROM), and later as EPROM. Modifications to the program memory required physically changing the memory.

As the need to update the programs of the microprocessor and applications in system and allow for more than one time became more important, NOR-type flash memory was used. As the demand for serially down loading the audio and video slow-speed data, the high-density NAND-type flash was commonly used for cost reduction. But for those requiring byte-alterable small data memory, EEPROM was replacing flash memory. These three technologies were developed to provide in-system rewriteability. However, processes of EEPROM, NOR-type flash, NAND-type flash memories are not fully compatible in the present technology and are difficult to integrate on the same integrated circuit chip.

As the applications for microprocessors and microcontrollers are becoming more pervasive, the need for storage that is permanent and will not fail or disappear when power is removed is required. In most applications, the program is not modified often. However, the application data is changed relatively frequently. The program memory can be classified as configuration, traceablity, boot program, or main program and application programs. The application data includes information from any external input to the system, e.g., operational, instrument, recorder, or sensor data that is required for historical purposes or to maintain continuity of operation after power down or power loss. Data memory is typically frequently altered over the lifetime of the application, thus demand for much higher program/erase (P/E) cycles of more than 500K.

Recently, there are more and more applications that require addition of more security functions in smart card functions such as e-passport and SIM-card. Most of the security schemes are mandatory asking to store personalized biometric data such as DNA, iris, facial and finger prints. Traditionally, the small NAND-flash cell was not used in low-density card technology, thus the large NOR-type flash cell or the larger EEPROM cell were employed instead to store such biometric data. The effective cell size of 1-transistor NAND is around $4\lambda$ square, while 1-transistor NOR-type Flash is around $10\lambda0$ square and 2-transistor EEPROM cell is about $80\lambda$ square. Please, note that $\lambda$ is a unit of the minimum feature size. That means $\lambda$ of a 0.13 µm process is 0.13 µm. Obviously, using the big 1-transistor NOR Flash and the bigger EEPROM cell to store personalized biometric data is wasteful of space. Particularly, in smart card technology, the final die size of a smart card system-on-a-chip that contains all Flash, EEPROM, SRAM, CPU, and Cryptographic processor has to be made within 25 mm square to avoid die cracking. A system-on-a-chip (SOC) integrates all components of a computer system into a single chip. The chip contains an embedded computer processor, program memory, application data memory, and appropriate input/output function. In applications such as cellular telephones and wireless personal digital assistants, a SOC contains digital, analog, mixed-signal, and radio-frequency functions within a single integrated circuit chip With higher and higher security required for smart card applications, the pressure of more and more personalized data is strongly required in a tiny die area of card. For example, storing ten finger prints is more preferable than to store just one thumbprint from security viewpoint. Having facial picture data from more angles is superior to the data from just one angle. Storing whole finger prints, iris and facial pictures or even DNA in one chip is better than to store part of it from security perspective.

The cells size of the EEPROM and NOR-type Flash memories no longer make these memories a cost effective solution to store personalized biometric data. The smallest cell size of 1-transistor NAND-type flash as noted above is $4\lambda$ square and is preferably used for personalized data storage memory.

High-level language software such as Java card system from Sun Microsystems, Inc., Santa Clara, Calif. 95054 provide easy and fast development software processes for creating and integrating software for multiple application down-loadable programs. Therefore, a flexible, easily partitioned small, non-uniform block size NOR-type flash system for multiple function programs is desirable in smart card applications.

The traditional large cell size of EEPROM technology is essentially non-scalable below 0.25 µm and thus it is not suitable for storing memory density higher than 1 Mb (128 KB). The trend is to use low-cost flash technology to replace traditional EEPROM but still retain the features of byte-alterable scheme and high P/E cycles of more than 500K.

The number of times that a nonvolatile memory must be altered determines the endurance requirement of the device. Nonvolatility requires the device to retain data without power applied for the lifetime of the application. The lifetime of the application determines the data retention requirement of the device. Both of the reliability requirements of endurance and data retention have associated failure rates, which must be minimized. Since NOR-type flash memories is employed as the program and application memory, it has the less amount of reprogramming and erasing, therefore, it must have the longest data retention and require the medium endurance (approximately 100,000 program/erase cycles). Conversely, the EEPROM, employed as data memory, must be able to be modified repeatedly and therefore must have higher endurance (more than 1 million program and erase cycles). The NAND-type flash nonvolatile memory preferably used to store personalized data. It does not require too many updates and endurance (approximately 10K program/erase less cycles depending on the applications).

U.S. Pat. No. 6,801,458 (Sakui, et al.) provides a memory cell array that has a unit memory circuit formed from one memory cell and two select transistors sandwiching the memory cell. One block has one control gate line. Memory cells connected to one control gate line form one page. A sense amplifier having a latch function is connected to a bit line. In a data change operation, data of memory cells of one page are read to the sense amplifiers. After data are superscribed on data in the sense amplifiers, and a page erase is performed, data in the sense amplifiers are programmed in the memory cells of one page. Superscription of data in the sense amplifiers allows a data change operation for byte data or page data.

Sakui, et al. provides essentially 3-transistor EEPROM cell based on the structure of NAND cell. Each block of the EEPROM cells are grouped together in the individual wells such that the bulk of each memory cell of the block is commonly connected. Table 1 illustrates the voltages required for erasure for a selected memory cells and prevention of erasure of unselected memory cells.

TABLE 1

|  | Vg | Vd | Vs | Vbulk |
|---|---|---|---|---|
| Erase (selected) | 0 V | +17.5 V | +17.5 V | +18~+20 V |
| Erase (unselected) | Floating | +17.5 V | +17.5 V | +18 V~+20 V |

SUMMARY OF THE INVENTION

An object of this invention is to provide a nonvolatile memory integrated circuit integrating of three in-system reprogrammable nonvolatile memories of NOR-type Flash, NAND-type Flash and EEPROM on a single integrated circuit die.

Another object of this invention is to provide a system-on-a-chip that integrates of NOR-type Flash, NAND-type Flash and EEPROM for applications of program, short term and long term application data within the system-on-a-chip.

To accomplish at least one of these objects, a nonvolatile memory integrated circuit is placed on a substrate. The nonvolatile memory is formed of a plurality of nonvolatile memory arrays placed on the substrate. The plurality of nonvolatile memory arrays are selected from the NOR configured flash memory, NAND configured flash memory, a two transistor electrically erasable programmable read only memories, or a three transistor electrically erasable programmable read only memories.

A memory control circuit is in communication with external circuitry to receive address, command, and data signals. The memory control circuit then interprets the address, command, and data signals, and transfers the address, command and data signals for programming, reading, and erasing to the first, second and third nonvolatile memories.

A voltage generator generates a very large positive programming voltage (+18V) and a very large negative erasing voltage (−18V). The voltage generator then transfers the very large positive programming voltage (+18V) to selected first sub-arrays of the plurality of nonvolatile memory arrays for programming the selected first sub-arrays. The very large negative erasing voltage (−18V) is transferred to selected second sub-arrays of the plurality of nonvolatile memory arrays for erasing the selected second sub-arrays. The voltage generator further generates a power supply voltage, a first moderately high positive program voltage, a second moderately high positive program voltage, an intermediate positive program voltage, and a ground reference voltage.

The voltage generator is contained in a first triple well structure formed on the substrate. The first triple well structure includes a deep well of a first conductivity type formed within the substrate and a shallower well of a second conductivity type formed within the deep well of the first conductivity type.

If one of the plurality of nonvolatile memory arrays is the NOR configured flash memory, programming the selected first sub-arrays is accomplished by setting at least one bit line of the selected first sub-arrays to the intermediate positive program voltage, at least one word line of the selected first sub-arrays to the first moderately high positive program voltage, at least one source line of the selected first sub-arrays to the ground reference voltage, and a bulk region of all cells of the selected first sub-array to the ground reference voltage. The selected first sub-arrays are further programmed by setting at least one select gate of the selected first sub-arrays to the very large positive programming voltage (+18V). The first sub-arrays are programmed in less than approximately 10 µs.

Erasing selected second sub-arrays of the plurality of nonvolatile memory arrays configured as the NOR configured flash memory is accomplished by setting at least one word line of the selected second sub-arrays to the very large negative erasing voltage (−18V), at least one source line of the selected second sub-arrays, and a bulk region of all cells of the selected second sub-array to the ground reference voltage. The selected second sub-arrays are further erased by setting at least one select gate of the selected second sub-arrays to the power supply voltage. The second sub-arrays are erased in less than approximately 5 ms, preferably less than approximately 2.5 ms.

If one of the plurality of nonvolatile memory arrays is the NAND configured flash memory, programming the selected first sub-arrays is accomplished by setting at least one bit line of the selected first sub-arrays to the second moderately high positive program voltage, at least one word line of the selected first sub-arrays to the very large positive programming voltage (+18V), at least one source line of the selected first sub-arrays to the second moderately high positive program voltage, and a bulk region of all cells of the selected first sub-array to the ground reference voltage. The first sub-arrays are programmed in approximately 200 µs.

Erasing selected second sub-arrays of the plurality of nonvolatile memory arrays configured as the NAND configured flash memory is accomplished by setting at least one word line of the selected second sub-arrays to the very large negative erasing voltage (−18V), very large negative erasing voltage (−18V), at least one source line of the selected second sub-arrays, and a bulk region of all cells of the selected second sub-array to the ground reference voltage. The second sub-arrays are erased in less than approximately 5 ms, preferably in less than approximately 2.5 ms.

If one of the plurality of nonvolatile memory arrays is the two transistor electrically erasable programmable read only memories, programming the selected first sub-arrays is accomplished by setting at least one bit line of the selected first sub-arrays to the intermediate positive program voltage, at least one select gate line of the selected sub-arrays to the power supply voltage, at least one word line of the selected first sub-arrays to the moderately high positive program voltage, at least one source line of the selected first sub-arrays to the ground reference voltage, and a bulk region of all cells of the selected first sub-array to the ground reference voltage. Those cells of the selected sub-array not programmed but have the word line at the moderately high positive program voltage are inhibited from programming by setting select gates of non-selected cells of the selected sub-arrays to the very large positive programming voltage (+18V). Those cells of non-selected sub-arrays not programmed are inhibited from programming by setting the bit lines, word lines, source lines, and the bulk region of all cells of the non-selected first sub-array of the non-selected cells to the ground reference voltage, select gates of non-selected cells of the selected sub-arrays to the power supply voltage. The first sub-arrays are programmed in less than approximately 5 ms, preferably less than approximately 2.5 ms.

Erasing selected second sub-arrays of one of the plurality of nonvolatile memory arrays configured as the two transistor electrically erasable programmable read only memories is accomplished by setting at least one select gate line of the selected sub-arrays to the power supply voltage, at least one word line of the selected second sub-arrays to the very large negative erasing voltage (−18V), at least one bit line of the selected second sub-arrays, at least one source line of the selected second sub-arrays, and a bulk region of all cells of the selected second sub-array to the ground reference voltage. The second sub-arrays are erased in less than approximately 5 ms, preferably in less than approximately 2.5 ms.

If one of the plurality of nonvolatile memory arrays is the three transistor electrically erasable programmable read only memories, programming the selected first sub-arrays is accomplished by setting at least one bit line of the selected first sub-arrays to the ground reference, at least one first select gate line of the selected sub-arrays to the power supply voltage, at least one word line of the selected first sub-arrays to the very large positive programming voltage (+18V), at least one source line of the selected first sub-arrays to the ground reference voltage, and a bulk region of all cells of the selected first sub-array to the ground reference voltage. Programming the selected first sub-arrays is further accomplished by setting at least one second select gate of the selected first sub-arrays to a ground reference voltage or to the power supply voltage. Those cells of the selected first sub-arrays not programmed but have the word line at the very large positive programming voltage (+18V) are inhibited from programming by setting bit lines of non-selected cells of the selected sub-arrays to the power supply voltage. The first sub-arrays are programmed in less than 10 µS, preferably less than approximately 1 µS.

Erasing the second selected sub-array of one of the plurality of nonvolatile memory arrays configured as the three transistor electrically erasable programmable read only memories is accomplished by setting at least one first select gate line and second select gate line of the selected sub-arrays to the power supply voltage, at least one word line of the selected second sub-arrays to the very large negative erasing voltage (−18V), at least one bit line of the selected second sub-arrays, at least one source line of the selected second sub-arrays, and a bulk region of all cells of the selected second sub-array to the ground reference voltage. The second sub-arrays are erased in less than approximately 5 ms, preferably, in less than approximately 2.5 ms.

Those of the plurality of nonvolatile memory array that are NAND configured flash memory and a two transistor electrically erasable programmable read only memories, or a three transistor electrically erasable programmable read only memories may have common bit line address decoders and be essentially merged into one array.

Those of the plurality of nonvolatile memory arrays that are NOR configured flash memories retain digital program data and other long term digital data. Those of the plurality of nonvolatile memory arrays that are NAND configured flash memory retain biometric identification digital data, short electronic mail digital data, electronic phone book digital data, and other digital data not requiring rapid access. Those of the plurality of nonvolatile memory arrays are the two transistor electrically erasable programmable read only memories or the three transistor electrically erasable programmable read only memories retain byte alterable digital data.

The plurality of nonvolatile memory arrays may be placed directly on the surface of the substrate or contained within a second triple well structure formed on the substrate. The first triple well structure comprises a deep well of the first conductivity type formed within the substrate and a shallower well of the second conductivity type formed within the deep well of the first conductivity type.

BRIEF DESCRIPTION OF THE DRAWINGS

FIG. 2a is a schematic diagram of a block or sub-array of 1-transistor NOR-type flash nonvolatile memory cells of the present invention.

FIG. 2b is a schematic diagram of one-transistor NAND-type memory cell connections in a 16-cell string within a block or sub-array of the present invention.

DETAILED DESCRIPTION OF THE INVENTION

The present invention is a unified process technology that permits integration of three kinds of in-system re-writable nonvolatile memories of EEPROM, NOR-type Flash nonvolatile memory and NAND-type Flash nonvolatile memory in one integrated circuit chip such as a system-on-a-chip for applications such as a smart card. The EEPROM, the NOR-type Flash nonvolatile memory, and the NAND-type nonvolatile memory are designed to be altered in system, with minimal hardware or software difficulty. The number of times the device must be altered within its application determines the endurance requirement of the device. Non-volatility requires the device to retain data without power applied for the lifetime of the application and the lifetime of the application determines the data retention requirement of the device. Both of the reliability requirements of endurance and data retention have associated failure rates, which must be minimized. Since NOR-type flash memories are employed as the program and application memory, it has the least amount of reprogramming and erasing, therefore, it must have the longest data retention and require the medium endurance (approximately 100,000 program/erase cycles). Conversely, the EEPROM, employed as application data memory, must be able to be modified repeatedly and therefore must have higher endurance (more than 1 million program and erase cycles). The NAND-type memory of the invention is preferable to be used to store personalized application data, it does not require too many updates and endurance (approximately 10K program/erase less cycles depending on the applications).

Figure 1A:
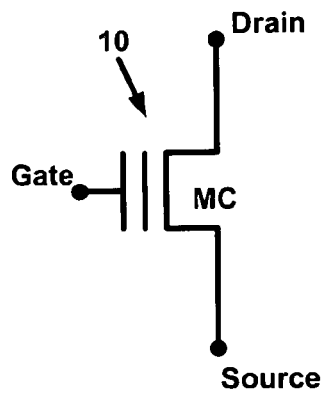
FIG. 1a is a schematic diagram of a floating gate memory cell of this invention.
Figure 1B:
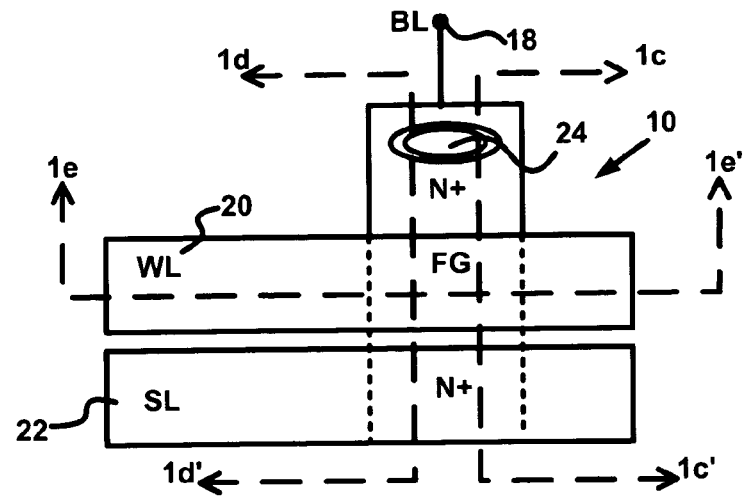
FIG. 1b is planar view of a floating gate memory cell of this invention.

FIGS. 1a–d illustrate a one-transistor floating gate flash memory cell used to form the NAND and NOR flash nonvolatile memory cells of this invention. The nonvolatile memory cell 10 shown in FIG. 1a is essentially a Metal Oxide Semiconductor (MOS) transistor with a drain, source, a floating gate, and a control gate. The nonvolatile memory cell 10 is formed within a p-type substrate 2. An $n^+$ drain region 4a and 4b and an $n^+$ source region 6a and 6b is formed within the p-type substrate 2.

A relatively thin gate dielectric or tunneling oxide 8 is deposited on the surface of the p-type substrate 2. A poly-crystalline silicon floating gate 12 is formed on the surface of the tunneling oxide 8 above the channel region 5 between the drain region 4a and 4b and source region 6a and 6b. An interpoly dielectric layer 14 is placed on the floating gate 12 to separate the floating gate 12 from a second layer of poly-crystalline silicon that forms a control gate 16.

The floating gate 12 is constrained to be aligned with the edges of the drain 4a and 4b and the source 6a and 6b over the channel region 5. Further, there are no "wings" as shown in the U.S. patent application Ser. No. 10/351,180 and the floating gate is constrained to the width of the of the drain 4a and 4b and the source 6a and 6b. The elimination of the "wings" allow the memory cell 10 to be made 20% smaller than the similar one in prior art by reducing the coupling ratio from the control gate 16 to floating-gate 12 in physical layout. The programming performance is maintained by increasing the word line program voltage In an application, of a single transistor nonvolatile memory cell of this invention within a flash memory, the p-type substrate 2 is connected to a substrate biasing voltage, which in most instances is the ground reference potential (0V). The source region 6a and 6b is connected to a source voltage generator through the source line terminal SL 22. The control gate 16 is connected through the word line terminal WL 20 to a control gate voltage generator. And the drain region 4a and 4b is connected through the contact 24 to the bit line 18 to a bit line voltage generator.

The bulk region between the drain 4a and 4b and source 6a and 6b is integral to the P-type substrate 2. Alternately, the memory cell may be formed in a triple well structure. In a triple well structure an N-type material is diffused into the substrate to form a deep well. A P-type material is then diffused into the deep N-type well. The memory cell 10 is then formed in the P-type well. The triple well structure allows more isolation between different nonvolatile array types integrated on the single integrated circuit chip.

The NAND-type flash nonvolatile memory cell employs a Fowler Nordheim process for programming and erasing. Alternately, the NOR-type flash cell uses a Channel-Hot-Electron process (CHE) for programming and Fowler Nordheim process (FN) for channel erase. The drain 4a and source in FIG. 1c have a lower concentration of boron than that shown in FIG. 1d and are used to for the NAND type flash nonvolatile memory cell. The drain 4b and source 6b of FIG. 1d have a higher concentration boron diffusion implant in memory cell's drain 4b area to generate a high electric field in the P-N junction between the drain 4b and the channel region 5 to generate hot-electrons for the CHE process as described in U.S. patent application Ser. No. 10/223,208.

The advantage of CHE program of the NOR-type flash nonvolatile memory cell is a fast program within around 5 µs per byte. But the disadvantage is that the program current is pretty high at 200 µa per cell. That is why CHE can only be performed in unit of byte by using on-chip high voltage charge pump. The erase and program conditions of NOR-type 1-transisior Flash memory cell 10 are listed in Table 2 below.

TABLE 2

| Voltage | BL | WL | SL | Bulk (P-sub. or triple P-well) | Scheme |
|---|---|---|---|---|---|
| Erase | 0 | −18 V | 0 | 0 | FN (Channel) |
| Program | +5 V | +10 V | 0 | 0 | CHE |

Refer now to FIG. 2a for a description of the 1-transistor NOR-type cells of the present invention connected to form a basic block or sub-array. The 1-transistor NOR-type cells along a portion of a global bit line GBL and local bit line LBL within a block. The drains of stacked gate transistor M1a, M2a, M3a, M4a, M1b, M2b, M3b and M4b are connected to Local bit line LBL through one select transistor M1s device. The gate of the select transistor M1s is connected to select gate line SG1 and the gates of the stacked gate transistors of each floating gate memory cell are connected to respective word lines WL1, WL2, WE3 and WL4. The sources of the stacked gate transistors M1a and M1b are connected to the common source line SL1. Similarly, the sources of each of the pairs of the stacked gate transistors M2a and M2b, M3a and M3b, M4a and M4b, are respectively connected to the common source lines SL2, SL3, and SL4. This structure of pair wise connection of the sources of the stacked gate transistors is maintained through out a NOR-type flash nonvolatile memory. NOR-type Flash cell array is organized as a matrix with of rows and columns plus one row of select transistors M1s. For traditional NOR-type cell array, typically the maximum block of 64 KB contains 512 rows (WL), 256 source lines (SL) and 1,024 columns (BL) and the minimum block of 8 KB includes 64 rows (WL), 32 source lines (SL) and 1,024 columns (BL) plus one additional row of select transistors.

The programming and erasing conditions for a block of NOR Flash array are as shown in Table 3 below. As noted above, the NOR-type flash nonvolatile memory cell of FIG. 1d has the boron enhanced drain diffusion 4b of FIG. 1d to improve the preferable programming scheme is using CHE. The gates of cells in same row are connected to respective word lines WL1, ..., WL8. The word lines WL1, ..., WL8 are connected the output of a row decoder that is connected to a high voltage generator that provides a relatively large positive programming voltage (+10V) and a large negative erasing voltage (−18V) to selected word lines WL1, ..., WL8. The high voltage generator further generates a relatively large select voltage (+18 v) to the gate select line (SG1).

The programming as shown in Table 3 applies a +5V reference voltage to the global bit line GBL and thence to the selected local bit line LBL to apply the +5V reference voltage (+5V) to the drains of the stacked gate transistors of the memory cells M1a, M2a, M3a, M4a, M1b, M2b, M3b and M4b. The row decoder transfers the large select voltage (+18V) to the select gate of the select transistor M1s of the block having the selected memory cells M1a, M2a, M3a, M4a, M1b, M2b, M3b and M4b to be programmed. The source line for the selected memory cells M1a, M2a, M3a, M4a, M1b, M2b, M3b and M4b are set to the ground reference voltage level. The bulk of the stacked gate transistors M1a, M2a, M3a, M4a, M1b, M2b, M3b and M4b is essentially the substrate or the P-well in a triple well structure and is set to the ground reference voltage level.

The erase scheme uses the channel FN. The array is erased on selected word lines WL1, ..., WL8, with the global bit line GBL held to the ground reference voltage level and a large negative erasing voltage (−18V) of approximately −18V applied to the single selected word line WL1, ..., WL8. The cells are collectively erased to lower threshold voltage Vt without disturbing to the rest of word lines WL1, ..., WL8 either in the same selected block or the remaining blocks. The large negative erasing voltage (−18V) voltage is coupled from the output of row-decoder during erase. Therefore, unlike to traditional NOR-type cell array, a small size of page erase operation on a single word line WL1, ..., WL8 can be effectively and independently achieved with high endurance cycles. The source line for the selected memory cells M1a, M2a, M3a, M4a, M1b, M2b, M3b and M4b are set to the ground reference voltage level. The bulk of the stacked gate transistors M1a, M2a, M3a, M4a, M1b, M2b, M3b and M4b is similarly set to the ground reference voltage level.

TABLE 3

| Voltage | BL | WL (selected) | SL (selected) | Bulk | SG (selected) | Scheme |
|---|---|---|---|---|---|---|
| Erase | 0 | −18 V | 0 | 0 | VDD | FN (channel) |
| Program | +5 V | +10 V | 0 | 0 | +18 V | CHE |

A NAND array structure, as shown in FIG. 2b, is constructed by serially connecting the stacked gate transistors MC1, ..., MC16 of the memory cells in a string. Normally, each string may have 16 or 32 stacked gate transistors MC1, ..., MC16 of the memory cells serially connected, depending on the NAND density. For higher density NAND, 32-cell string is used. For low density NAND, usually, 16-cell string is commonly used. The stacked gate transistors MC1, ..., MC16 have each source node connected to the drain node of the stacked gate transistor immediately adjacent to form the serial string. The control gate of the stacked gate transistor MC1, ..., MC16 is connected to word line (WL1, ..., WL16). The drain of the gating transistor M1S is connected to the global bit line GBL and the source of the gating transistor M1S is connected to the drain of the first stacked gate transistor MC1 of the serial string of stacked gate transistors MC1, ..., MC16. The drain of the gating transistor M2S is connected to the source of the last stacked gate transistor MC16 and the source of the gating transistor M2S is connected to the source line SL.

As stated above, the Fowler Nordheim process is used for the channel erase and the channel program. The channel erase decreases the NAND-type Flash nonvolatile memory cell's threshold voltage Vt and the channel program increases the cell's threshold voltage Vt respectively.

Figure 1C:
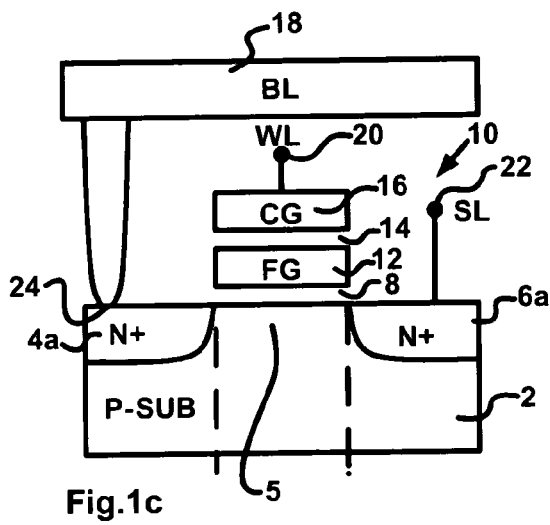
FIG. 1c is a cross sectional view of a NAND configured flash nonvolatile memory cell of this invention.
Figure 1D:
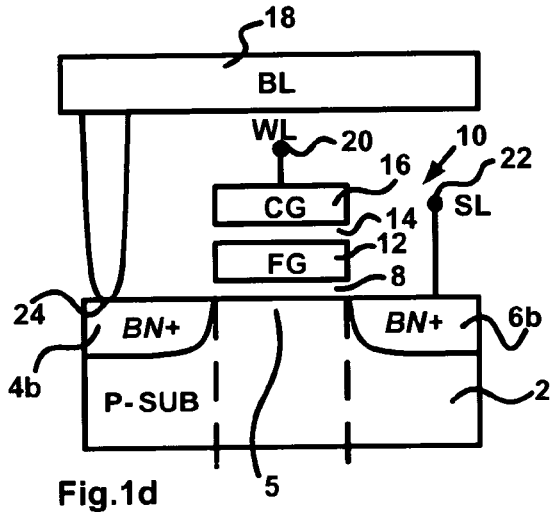
FIG. 1d is a cross sectional view of a NOR configured flash nonvolatile memory cell of this invention.
Figure 1E:
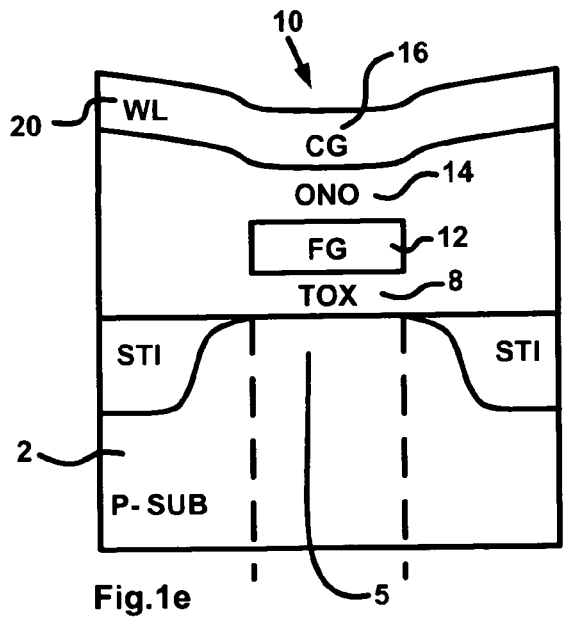
FIG. 1e is a cross sectional view of the flash nonvolatile memory cell of this invention.

The erase and program conditions of NAND-type 1-transisior Flash memory cell 10 of FIG. 1c are listed in Table 4 below.

TABLE 4

| Voltage | Drain | WL | Source | Bulk (P-sub. or triple P-well) | Scheme |
|---|---|---|---|---|---|
| Erase | 0 | −18 V | 0 | 0 | FN (Channel) |
| Program | 0 V | +18 V | 0 V | 0 | FN (Channel) |

The programming of the NAND-type flash nonvolatile memory cell is performed by setting the source and drain of the cell to the ground reference voltage. The gate of the NAND-type flash nonvolatile memory cell is placed through the word line (WL) at the large positive programming voltage of approximately +18V from the high voltage generator. The bulk of the cell is the essentially the P-substrate or a P-well in a triple well configuration and is set to the ground reference voltage.

The erasing of the NAND-type flash nonvolatile memory cell is performed by setting the source and drain to the ground reference voltage. The gate through the word line (WL) is set to a large negative erasing voltage (−18V) of approximately −18V from the high voltage generator. The bulk being the substrate or P-well is set to the ground reference voltage.

TABLE 5

| Voltage | GBL (sel) | GBL (unsel) | WL1 | WL2–WL16 | SL | Bulk | SG1 | SG2 | Scheme |
|---|---|---|---|---|---|---|---|---|---|
| Erase | 0 | 0 | −18 V | 0 | 0 | 0 | VDD | VDD | FN (channel) |
| Program | 0 | VDD | +18 V | 0 | 0 | 0 | VDD | 0 | FN (channel) |

In Table 5 above illustrates the voltages necessary for programming and erasing blocks or sub-arrays of the NAND-type flash nonvolatile memory as shown in FIG. 2b. For the erase operation, the selected global bit line GBL and the source line SL are coupled to the ground reference voltage (0V) and both the select gates SG1 and SG2 gates are coupled to the power supply voltage VDD from a voltage generator to pass the channel voltages ground level to the selected cell's drain and source. If the block or sub-array is not selected, the unselected bit line GBL (unselected) is set to the ground reference voltage.

The word line WL1, ..., WL16 connected to the gate of selected stacked gate transistors MC1, ..., MC16 is coupled to the large negative erasing voltage (−18V) from the high voltage generator. This is as opposed to the NAND-type flash nonvolatile memory cells of the prior art where a P-well is coupled to a large positive +18V with its gate coupled to the ground reference voltage. With the large negative voltage (−18V) placed on the word line WL1 of the gate of the selected stacked gate transistor MC1 and the ground reference voltage placed on the word lines WL2, ..., WL16 connected to the gates of the non-selected stacked gate transistors MC2, ..., MC16, the FN tunneling effect will occur on NAND-type flash nonvolatile memory cells connected on the word line WL1. As a result, a single word line WL1 can be effectively erased without any disturbing to the remaining word lines, WL2, ..., WL16, in the same selected block. Therefore, a small size of page erase can be realized with NAND-type flash nonvolatile memory cell of the present invention.

By contrast, the NAND-type memory cells of the prior art can only perform block erase of all the memory cells within the common P-well receiving the large positive erasing voltage (+18 v). Depending on the number of word lines in each block of NAND-type flash nonvolatile memory cell array, the erase size of the present invention can be flexibly kept to the minimum of one word line and maximum of whole block.

The programming scheme, the selected global bit line GBL is coupled to the ground reference voltage (0V) and the unselected global bit lines GBL (unselected) coupled to the power supply voltage VDD. The gate of the select transistor MS1 is coupled to the power supply voltage VDD through the select gate line SG1 to keep the top select transistors in conduction state and the gate of the select transistor MS2 is coupled to the ground reference voltage through the select gate SG2 to keep the bottom selected transistors in non-conduction state. The source line SL is set to the ground or VDD reference voltage.

For programming the selected NAND-type flash nonvolatile memory cell, one of the gate of the selected stacked gate transistor MC1, ..., MC16 in a selected block has a large positive programming voltage of approximately +18V coupled through one selected word line WL1, ..., WL16 from the high voltage generator. The word lines WL1, ..., WL16 that are not selected and are physically above the selected cell in the selected block are coupled to the appropriate voltage higher than VDD to pass the VDD-Vt voltage to drain the selected NAND flash nonvolatile memory cell MC1, ..., MC16. The remaining NAND flash nonvolatile memory cell MC1, ..., MC16 of deselected word lines WL1, ..., WL16 below the selected cell MC1, ..., MC16 are coupled to the ground reference voltage. All other deselected word lines WL1, ..., WL16 and select gates and the source lines in the deselected blocks are coupled to the ground reference voltage to inhibit the non-selected cells from programming disturb. As described above, the program and erase processes use channel Fowler Nordheim scheme. The selected memory cells' threshold voltage Vt is increased after program but decreased after erase. The erase and program operations can be performed in units of pages, blocks and chip as opposed to the only larger block of the NAND-type memory cells of the prior art.

Figure 3A:
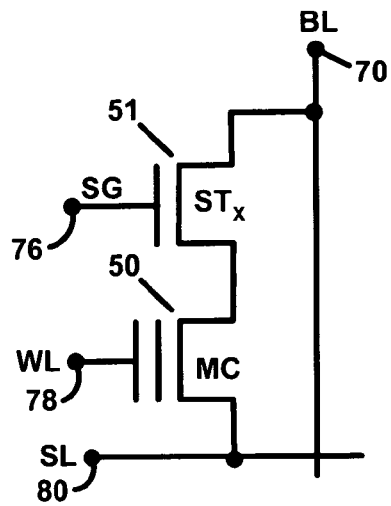
FIG. 3a is a schematic diagram of a 2-transistor EEPROM memory cell of the present invention.
Figure 3B:
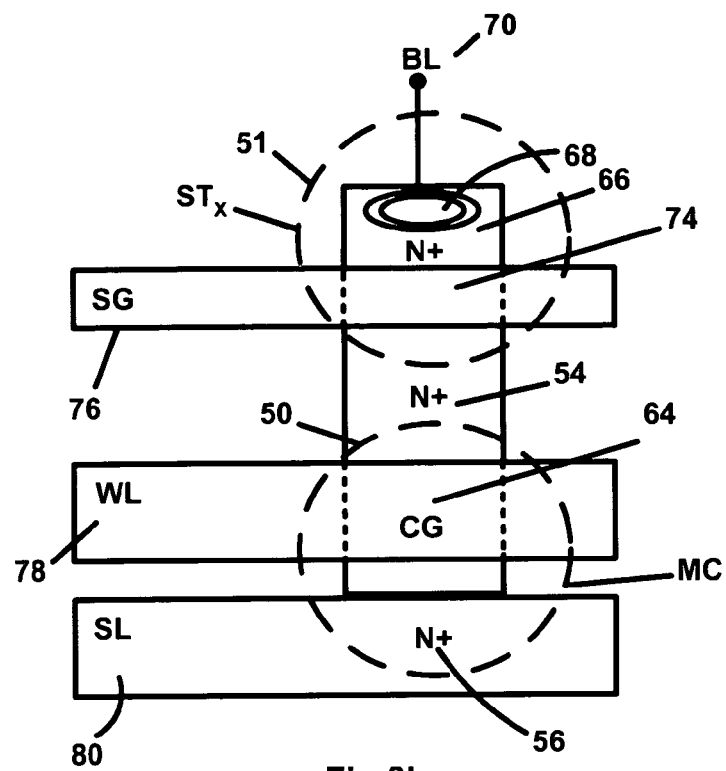
FIG. 3b is a planar view of a 2-transistor EEPROM memory cell of the present invention.
Figure 3C:
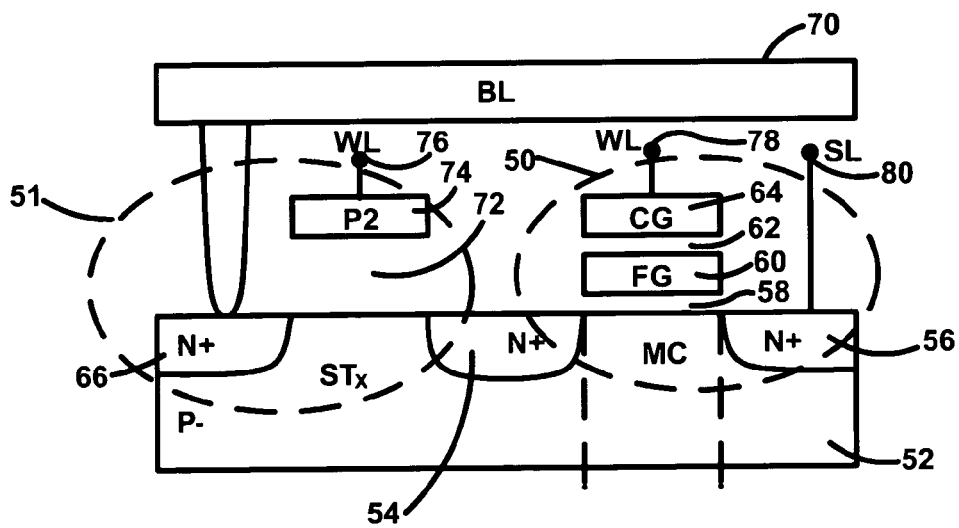
FIG. 3c is a cross sectional view of a 2-transistor EEPROM memory cell of the present invention.

The EEPROM is most suitable for applications having smaller increments of erasure and requiring more endurance (ability to withstand a high number of program and erase cycles). Refer to FIGS. 3a–3c for a description of the two transistor memory cell of this invention. The memory cell consists of a stacked gate or floating gate transistor 50 and a select gating transistor 51 is formed on a p-type substrate 52. An $n^+$ drain region 54 and an $n^+$ source region 56 is formed within the p-type substrate 52.

A relatively thin tunneling oxide 58 is deposited on the surface of the p-type substrate 52. A poly-crystalline silicon floating gate 60 is formed on the surface of the tunneling oxide 58 above the channel region between the drain region 54 and source region 56. An interpoly dielectric layer 62 is placed on the floating gate 60 to separate the floating gate 60 from a second layer of poly-crystalline silicon that forms a control gate 64.

The drain 54 fundamentally is the source of the select gating transistor 51. The drain 66 of the select gating transistor 51 is connected through the contact 68 to the bit line 70. The gate 74 of the select gating transistor 51 is a second level polycrystalline silicon layer that is placed over the gate oxide 72 between the drain 54 of the memory cell 50 and the drain 66 of the select transistor 51. The oxide 72 of gating device is thicker than tunnel oxide 58 of floating-gate device 50 to withstand +18V on gating transistor's 51 gate 74 during program operation.

When the tunneling oxide 58 is formed, a thicker gate oxide 72 is formed in the channel region between the drain 54 of the memory cell 50 and the drain 66 of the select transistor 51. The gate 74 is connected to the select control line 76, which conducts a select signal to the select gating transistor 51 to control the impact of the over-erasure of the memory cell.

In most applications of an EEPROM or flash memory having the two transistor configuration, the p-type substrate 52 is connected to a substrate biasing voltage, which in most instances this is the ground reference potential (0V). The drain region 66 of the select gating transistor 51 is connected to a bit line voltage generator through the contact 68 and the bit line terminal 70. The control gate 64 is connected through the word line terminal 78 to the control gate voltage generator. The select gating line 76 is connected to a select signal generator to provide the select signal to the gate 74 of the select gating transistor 51. And the source region 56 is connected to the source line 80 to a source line voltage generator.

The erase and program conditions of 2-transistor EEPROM cell of the present invention are listed in Table 6. To erase an EEPROM cell, the bit line generator sets the bit line 70 and thus the drain 66 of the gating transistor 51 to the ground reference level. The select gating generator sets the select gating line 76 and thus gate 74 of the select of the select gating transistor 51 to the power supply voltage VDD. The word line voltage generator sets the word line 78 and thus the control gate 64 of the memory cell 50 to the large negative erasing voltage (approximately −18V). The source line voltage generator sets the source line 80 and thus the source 56 is set to the ground reference voltage. The bulk of the EEPROM cell is set to the ground reference voltage. The erase process is the Fowler Nordheim tunneling process to the channel between the source 56 and the drain 54.

TABLE 6

|  | BL | SG | WL | SL | Bulk | Scheme |
|---|---|---|---|---|---|---|
| Erase | 0 | VDD | −18 V | 0 | 0 | FN (Channel) |
| Program Inhibit (selected WL) | 0 | +18 V | +10 V | 0 | 0 | No CHE |
| Program Inhibit (deselected WL) | 0 | 0 | 0 | 0 | 0 | No CHE |
| Program | +5 V | +18 V | +10 V | 0 | 0 | CHE |

The programming of a selected EEPROM cell has the bit line voltage generator setting the selected bit line 70 and thus the drain 66 of the gating transistor 51 to an intermediate level voltage of approximately +5V. The select gating generator sets the select gating line 76 and thus gate 74 of the select of the select gating transistor 51 to the power supply voltage +18V. The word line voltage generator sets the word line 78 and thus the control gate 64 of the memory cell 50 to a relatively large positive programming voltage (approximately +10V). The source line voltage generator sets the source line 80 and thus the source 56 is set to the ground reference voltage. The bulk of the EEPROM cell is set to the ground reference voltage. The programming process is the CHE process to the channel between the source 56 and the drain 54.

To prevent or inhibit programming of EEPROM cells on the selected word line 78, the bit line generator sets the bit line 70 and thus the drain 66 of the gating transistor 51 to the ground reference level. The select gating generator sets the select gating line 76 and thus gate 74 of the select of the select gating transistor 51 to the power supply voltage source +18V. The word line voltage generator sets the word line 78 and thus the control gate 64 of the memory cell 50 to the relatively large positive programming voltage (approximately +10V). The source line voltage generator sets the source line 80 and thus the source 56 is set to the ground reference voltage. The bulk of the EEPROM cell is set to the ground reference voltage. The unselected EEPROM cell is not affected during programming of the selected EEPROM cell.

To prevent or inhibit programming of EEPROM cells on the unselected word line 78, the bit line generator sets the bit line 70 and thus the drain 66 of the gating transistor 51 to either the ground or +5V reference level. The select gating generator sets the select gating line 76 and thus gate 74 of the select of the select gating transistor 51 to ground reference level. The word line voltage generator sets the word line 78 and thus the control gate 64 of the memory cell 50 to the ground reference voltage. The source line voltage generator sets the source line 80 and thus the source 56 is set to the ground reference voltage. The bulk of the EEPROM cell is set to the ground reference voltage. The erase process is the Fowler Nordheim tunneling process to the channel between the source 56 and the drain 54. The unselected EEPROM cell is not affected during programming of the selected EEPROM cell.

Figure 5A:
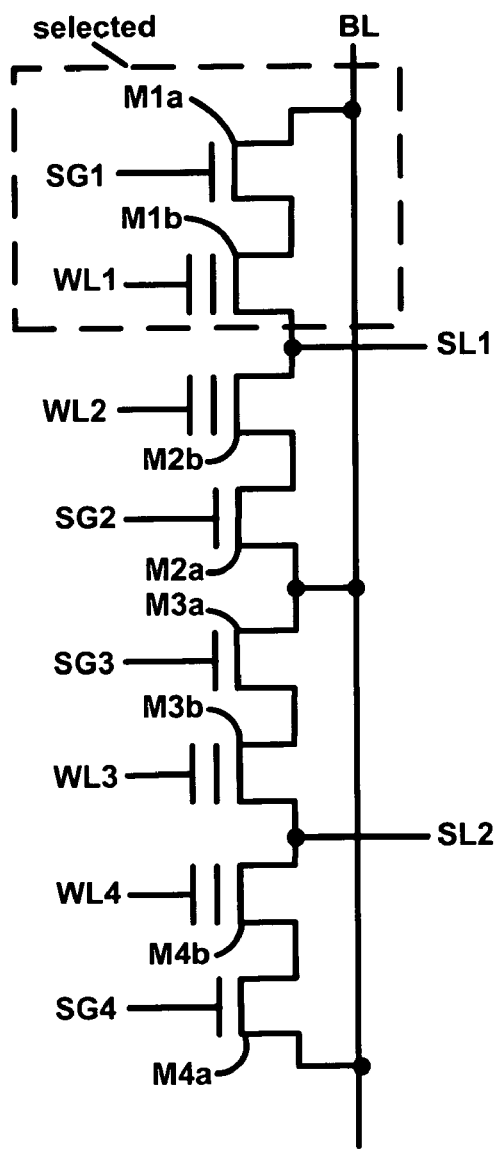
FIG. 5a is a schematic diagram of a block or sub-array of two-transistor EEPROM memory cells along a portion of a bit line of the present invention.

FIG. 5a illustrates a block or sub-array employing 2-transistor EEPROM cells of the present invention connected along a portion of a bit line BL. In this cell array configuration, the EEPROM effective cell size is big because each EEPROM cell has one stack-gate transistor with a corresponding select transistor. The EEPROM cells each contain a select transistor M1a, M2a, M3a, and M4a and a stacked gate transistor M1b, M2b, M3b, and M4b. The gates of the select transistors are connected to select gate lines SG1, SG2, SG3, and SG4, and the gates of the stacked gate transistors are connected to word lines WL1, WL2, WL3, and WL4. In each cell the drain of the select transistor M1a, M2a, M3a, and M4a is connected to the bit line BL, the source of the stacked gate transistors M1b and M2b are connected to the source line SL1, and the source of the stacked gate transistors M3b and M4b are connected to the source line SL2. Thus the EEPROM cells are connected pair wise to a source line. The cell containing select transistor M1a and stacked gate transistor M1b is designated for illustration as the selected cell, for which will be shown erasing and programming voltages in Table 6. With the above preferable program scheme and condition, there is no drain disturb for the remaining un-selected EEPROM cells during program operation when +5 volts is applied to the selected cell in the same bit line BL.

Furthermore, each select transistor Mna can be shared by multiple Mnb cells to reduce the effective cell size. For example, four or eight Mnb cells can be shared with one select transistor Mna. The higher number of Mnb cells sharing with one Mna, the smaller effective cell size with the tradeoff of program/erase cycles reduction due to drain program disturb happening those un-selected cells that shares same Mna select transistor. In this second type of 2-transistor EEPROM array uses effectively less than 2-transistor EEPROM cells of the present invention connected along a portion of a bit line BL. With four floating-gate EEPROM cells share one select transistor, thus the effective EEPROM cell size becomes 1.25-transitor. With eight stacked gate cells share one select transistor, thus the effective EEPROM cell size becomes 1.125-transistor.

Figure 4A:
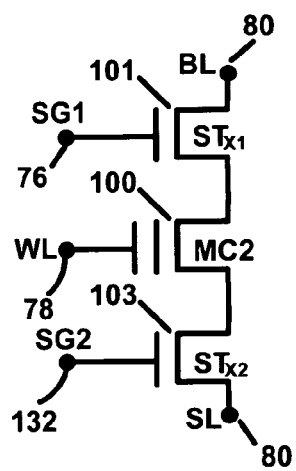
FIG. 4a is a schematic diagram of a 3-transistor EEPROM memory cell of the present invention.
Figure 4B:
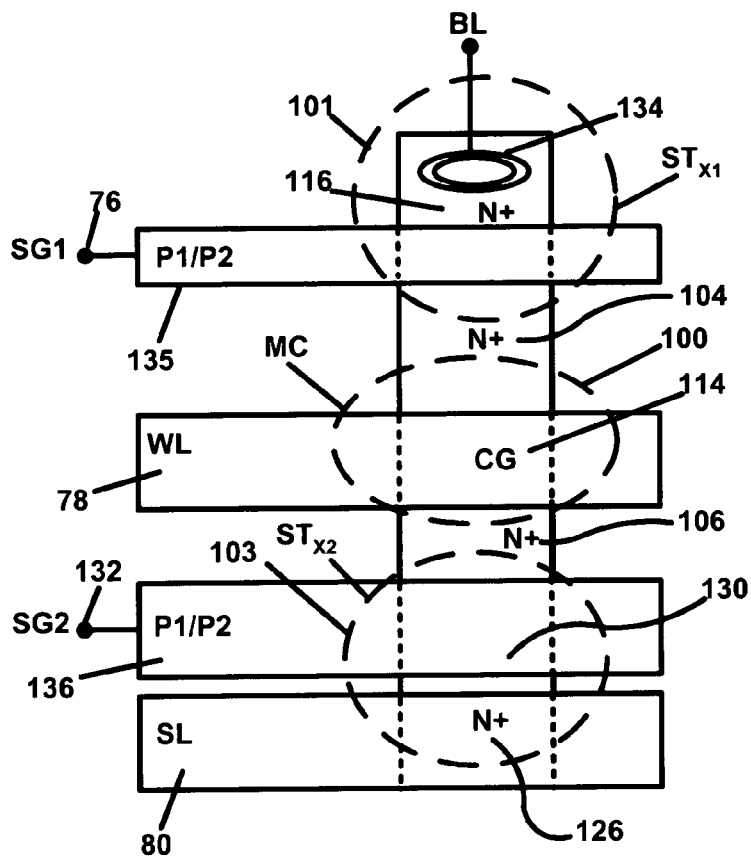
FIG. 4b is a planar view of a 3-transistor EEPROM memory cell of the present invention.
Figure 4C:
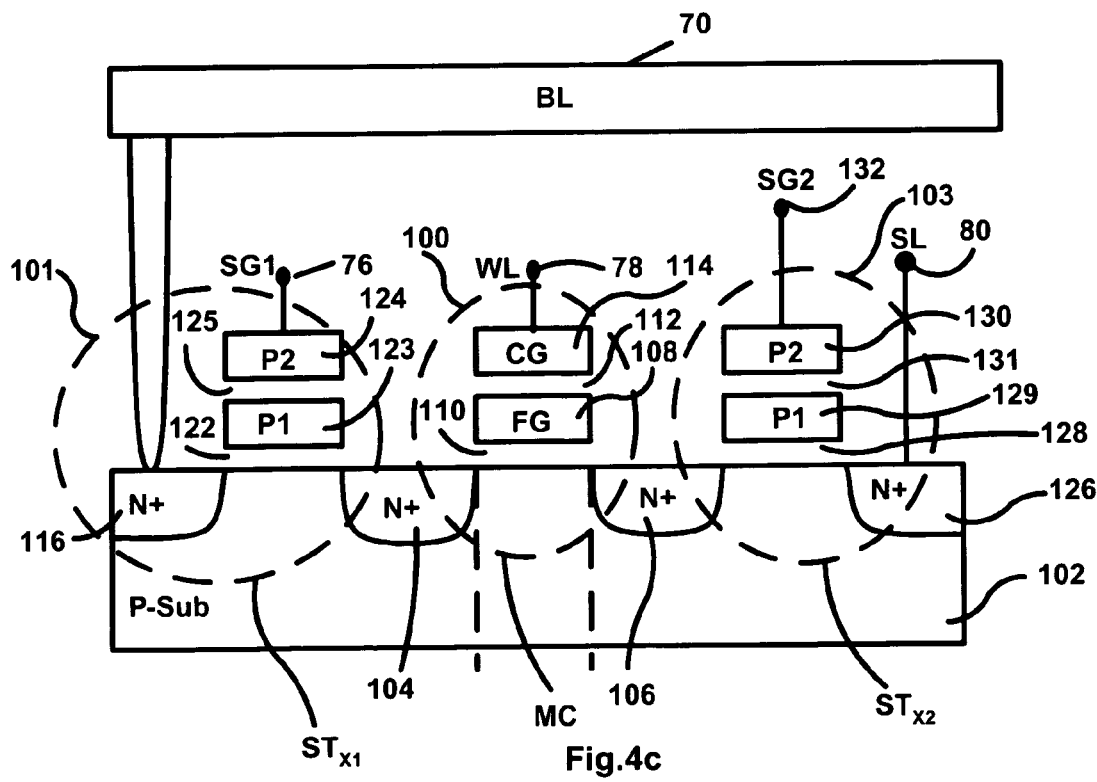
FIG. 4c is a cross sectional view of a 3-transistor EEPROM memory cell of the present invention.

An alternative to the two transistor EEPROM is the three transistor EEPROM, as shown in FIGS. 4a–4c. The memory cell consists of a stacked gate or floating gate transistor 100, a first select gating transistor 101, and a second select gating transistor 103 is formed on a p-type substrate 102. An $n^+$ drain region 104 and an $n^+$ source region 106 is formed within the p-type substrate 102.

A relatively thin tunneling oxide 108 is deposited on the surface of the p-type substrate 102. A poly-crystalline silicon floating gate 110 is formed on the surface of the tunneling oxide 108 above the channel region between the drain region 104 and source region 106. An interpoly dielectric layer 112 is placed on the floating gate 110 to separate the floating gate 110 from a second layer of poly-crystalline silicon that forms a control gate 114.

The drain 104 fundamentally is the source of the first select gating transistor 101. The drain 116 of the first select gating transistor 101 is connected through the contact 134 to the bit line 70. The first gate 123 of the first select gating transistor 101 is placed over the gate oxide 122 between the drain 104 of the memory cell 100 and the drain 116 of the select transistor 101. The interpoly dielectric layer 125 is formed over the first gate 123, with a second gate 124 having equivalent structure to the control gate 114 formed over the interpoly dielectric layer 125.

The first and second gates 123 and 124 are connected separately through wiring traces 135 to a location near the end of the word line 78. The wiring traces 135 are connected to the select control line 76, which conducts a select signal to the first and second gates 123 and 124 of the first select gating transistor 101 to control the impact of the over-erasure of the memory cell.

The source 106 fundamentally is the drain of the second select gating transistor 103. The source 126 of the second select gating transistor 103 is connected to the source line 80. The first gate 129 of the second select gating transistor 103 is placed over the gate oxide 128 between the drain 104 of the memory cell 100 and the drain 116 of the second select gating transistor 103. The interpoly dielectric layer 131 is formed over the first gate 129, with a second gate 130 having equivalent structure to the control gate 114 formed over the interpoly dielectric layer 131. The first and second gates 129 and 130 are connected separately through wiring traces 135 and 136 to a location near the end of the word line 78. The wiring traces 136 are connected to conduct a second select signal SG2 132 to the second select gating transistor 103 to similarly control the impact of the over-erasure of the memory cell 100.

In most applications of an EEPROM or flash memory having the three transistor configuration, the p-type substrate 102 is connected to a substrate biasing voltage, which in most instances this is the ground reference potential (0V). The drain region 116 of the first select gating transistor 101 is connected to a bit line voltage generator through the contact 134 and the bit line terminal 70. The control gate 114 is connected through the word line terminal 78 to the word line voltage generator. The first select gating line 76 is connected to a select signal generator to provide a first select signal to the gate 124 of the first select gating transistor 101. The second select gating line 132 is connected to a select signal generator to provide a second select signal to the gate 130 of the second select gating transistor 103. And the source region 126 of the second select gating transistor 103 is connected to the source line 80 to a source line voltage generator.

In order to make a compact cell size and array, both the select gating transistors 101 and 103 are preferably made of same size and structure as stacked gate or floating gate memory cell of NAND-type flash nonvolatile memory cell of FIGS. 1c in x-direction. The gates 124 and 130 of the first and second select gating transistors 101 and 103 are tied to gate select lines 76 and 132 to turn the first and second select gating transistors 101 and 103 device into non-floating gate poly1 NMOS devices.

The erase and program conditions of 3-transistor EEPROM cell of the present invention are listed in Table 7 below. To erase an EEPROM cell, the bit line generator sets the bit line 70 and thus the drain 116 of the first select gating transistor 101 to the ground reference level. The select gating generator sets the first select gating line 76 and thus the gate 124 of the first select gating transistor 101 to the power supply voltage VDD. The word line voltage generator sets the word line 78 and thus the control gate 64 of the memory cell 50 to the large negative erasing voltage (approximately −18V). The select gating generator sets the second select gating line 132 and thus the gate 130 of the second select gating transistor 103 to the power supply voltage VDD. The source line voltage generator sets the source line 80 and thus the source 126 of the second gating transistor 103 is set to the ground reference voltage. The bulk of the EEPROM cell is set to the ground reference voltage. The erase process is the low-current Fowler Nordheim tunneling process to the channel between the source 106 and the drain 104.

The programming of a selected three transistor EEPROM cell has the bit line voltage generator setting the selected bit line 70 and thus the drain 116 of the first select gating transistor 101 to a ground reference voltage. The select gating generator sets the first select gating line 76 and thus gate 124 of the first select gating transistor 101 to the power supply voltage VDD. The word line voltage generator sets the word line 78 and thus the control gate 64 of the memory cell 50 to a large positive programming voltage (approximately +18V). The source line voltage generator sets the source line 80 and thus the source 126 of the second select gating transistor is set to the ground reference voltage to prevent bit line leakage. The bulk of the EEPROM cell is set to the ground reference voltage. The programming process is the low-current FN process to the channel between the source 56 and the drain 54.

To prevent or inhibit programming of EEPROM cells on the selected word line 78, the bit line generator sets the bit line 70 and thus the drain 116 of the first select gating transistor 101 to the power supply voltage source VDD. The select gating generator sets the select gating line 76 and thus gate 124 of the select of the first select gating transistor 101 to the power supply voltage source VDD. The word line voltage generator sets the word line 78 and thus the control gate 114 of the memory cell 100 to the large positive programming voltage (approximately +18V). The select gating generator sets the select gating line 76 and thus gate 130 of the select of the second select gating transistor 103 to the power supply voltage source VDD. The source line voltage generator sets the source line 80 and thus the source 126 of the second select gating transistor 103 is set to the ground reference voltage. The bulk of the EEPROM cell is set to the ground reference voltage. The unselected EEPROM cell is not affected during programming of the selected EEPROM cell.

TABLE 7

| Voltage | BL | SG1 | WL | SG2 | SL | Bulk | Scheme |
|---|---|---|---|---|---|---|---|
| Erase | 0 | VDD | −18 V | VDD | 0 | 0 | FN (Channel) |
| Program Inhibit (selected WL) | VDD | VDD | +18 V | 0 | VDD/0 | 0 | No FN |
| Program | 0 | VDD | +18 V | 0 | VDD/0 | 0 | FN (Channel) |

Figure 5B:
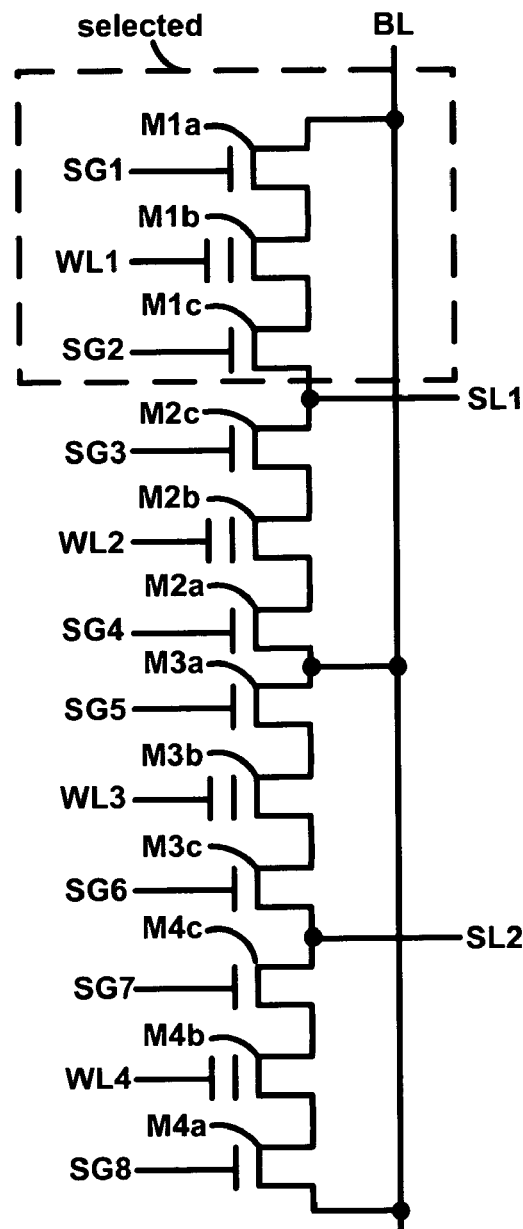
FIG. 5b is a schematic diagram of a block or sub-array of three-transistor EEPROM memory cells along a portion of a bit line of the present invention.

A block or sub-array of a three transistor EEPROM is shown in FIG. 5b. The EEPROM cells each contain a top select gating transistors M1a, M2a, M3a, and M4a and a bottom select gating transistors, M1c, M2c, M3c, and M4c and a stacked or floating gate transistors M1b, M2b, M3b, and M4b. The gates of the top select gating transistors M1a, M2a, M3a, and M4a are connected to select gate lines SG1, SG4, SG5, and SG8. The gates of the bottom select gating transistors, M1c, M2c, M3c, and M4c are connected to select gate lines SG2, SG3, SG6, and SG7, and the gates of the floating gate transistors M1b, M2b, M3b, and M4b are connected to word lines WL1, WL2, WL3, and WL4. In each cell the drains of the top select gating transistors M1a, M2a, M3a, and M4a are connected to the bit line BL, the sources of top select gating transistors M1a, M2a, M3a, and M4a are connected to the drains of floating gate transistors M1b, M2b, M3b, and M4b. The sources of the floating gate transistors M1b, M2b, M3b, and M4b are connected to the drains of bottom select gating transistors, M1c, M2c, M3c, and M4c. The source of the bottom select gating transistors, M1c and M2c connected to the source line SL1. The sources of the bottom select gating transistors M3c and M4c are connected to the source line SL2. Thus the 3-transistor EEPROM cells in FIG. 5b are connected in pairs to a source line. The cell containing top and bottom select transistors M1a and M1c and floating gate transistor M1b is designated as the selected cell for illustration, for which will be shown programming and erasing voltages in the Table 7 below.

To perform an erase of the selected floating gate transistors M1b, the bit line voltage generator sets the bit line BL and thus the drain of the top select gating transistors M1a, M2a, M3a, and M4a to the ground reference voltage. The word line voltage generator set the selected word line WL1 through a row decoder to the large negative erasing voltage (−18V). The word line voltage generator through the row decoder sets remaining unselected word lines WL2, WL3, and WL4 to the ground reference voltage. The source line generator sets the first source line SL1 to the ground reference voltage. Similarly the bulk being connected to the P-substrate is set to the ground reference voltage. The select gating generator sets the first and second select gating lines SG1 and SG2 to the power supply voltage level VDD. As described above, this performs the Fowler Nordheim tunneling process to the channel between the source and the drain of the floating gate transistor M1b.

TABLE 8

| Voltage | BL (sel) | WL1 (sel) | SL1 (sel) | Bulk | SG1 (sel) | SG2 (sel) | Scheme |
| --- | --- | --- | --- | --- | --- | --- | --- |
| Erase | 0 | −18 V | 0 | 0 | VDD | VDD | FN (channel) |
| Program | 0 | +18 V | 0 | 0 | VDD | 0 | FN (channel) |

To perform a programming of the selected floating gate transistors M1b, the bit line voltage generator sets the bit line BL and thus the drain of the top select gating transistors M1a, M2a, M3a, and M4a to the ground reference voltage. The word line voltage generator set the selected word line WL1 through a row decoder to the large positive programming voltage (+18V). The word line voltage generator through the row decoder sets remaining unselected word lines WL2, WL3, and WL4 to the ground reference voltage. The source line generator sets the first source line SL1 to the ground reference voltage or VDD. Similarly the bulk being connected to the P-substrate is set to the ground reference voltage. The select gating generator sets the first select gating line SG1 to the power supply voltage level VDD and the second gating line to the ground reference voltage to prevent bit line leakage. As described above, this performs the Fowler Nordheim tunneling process to the channel between the source and the drain of the floating gate transistor M1b.

The NOR-type, NAND-type, two-transistor EEPROM, and three-transistor EEPROM flash nonvolatile memories of this invention all require a voltage generator to produce the large positive programming voltage and the large negative programming voltage. Since the large positive programming voltage (+18V) and the large negative programming voltage (−18V) are applied to the word line or select gate lines as appropriate for programming and erasing these memories, there is no need for separate wells and control circuits to apply large voltages to the bulk of the floating gate transistors of the memory cells. This enables the integration of multiple arrays of the NOR-type, NAND-type, two-transistor EEPROM, and three-transistor EEPROM flash nonvolatile memories on a single substrate to form a single integrated circuit chip for such smart card applications as a SIM card or an electronic passport. The system-on-a-chip structure permits the NOR-type, NAND-type, two-transistor EEPROM, and three-transistor EEPROM flash nonvolatile memories to be incorporated with embedded processors and appropriate input/output devices on a single integrated circuit substrate.

Figure 6:
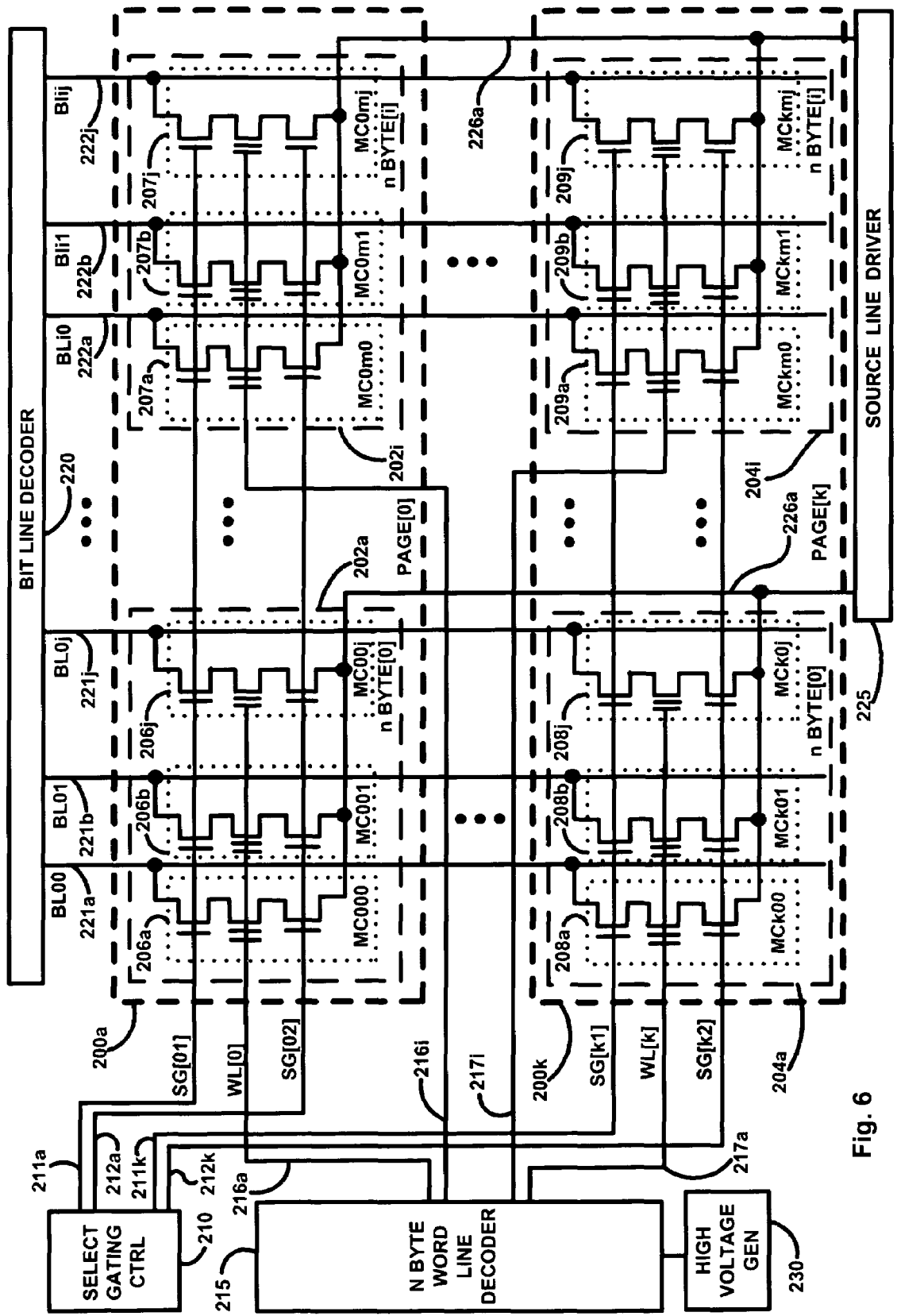
FIG. 6 is a schematic diagram a block or sub-array of a 3-transistor EEPROM memory array of the present invention organized with horizontal pages.

FIG. 6 illustrates a 3-transistor EEPROM memory array of the present invention organized by horizontal pages. Each horizontal page 200a, . . . , 200k is composed of a number of n Bytes 202a, . . . , 202i, and 204a, . . . , 204i that are oriented in the X direction of the select gate lines 211a, . . . , 211k and 212a, 212k. Each of the n Bytes 202a, . . . , 2021, and 204a, . . . , 204i contain a number of three transistor EEPROM memory cells 206a, . . . , 206j, 207a, . . . , 207j, 208a, . . . , 208j, and 209a, . . . , 209j as described in FIGS. 4a-4c. While the number of three transistor EEPROM memory cells 206a, . . . , 206j, 207a, . . . , 207j, 208a, . . . , 208j, and 209a, . . . , 209j would normally be eight within a Byte the number is not deterministic and may be any conveniently required number for instance 16 of the three transistor EEPROM memory cells 206a, . . . , 206j, 207a, . . . , 207j, 208a, . . . , 208j, and 209a, . . . , 209j for a two Byte application or 32 of the three transistor EEPROM memory cells 206a, . . . , 206j, 207a, . . . , 207j, 208a, . . . , 208j, and 209a, . . . , 209j for a four Byte application. Further, the number of Bytes 202a, . . . , 202i, and 204a, . . . , 204i may be any number dependent on the data requirements of the application.

The n Byte word line decoder 215 receives an address for the number of Bytes required to be transferred to or from the three transistor EEPROM memory array. The n Byte word line decoder, in many applications, decodes address to provide or receive 1, 2 or 4 Bytes for each data transfer. The n byte word line decoder 215 activates the appropriate word line 216a, . . . , 216i, and 217a, . . . , 217i to access the selected n Byte grouping 202a, . . . , 202i, and 204a, . . . , 204i.

The select gating controller 210 activates the select gates 211a, . . . , 211k, 212a, . . . , 212k to access the three transistor EEPROM memory cells 206a, . . . , 206j, 207a, . . . , 207j, 208a, . . . , 208j, and 209a, . . . , 209j of the selected n Byte grouping 202a, . . . , 202i, and 204a, . . . , 204i. The Bit line decoder 220 activates the bit lines 221a, . . . , 221j, 222a, . . . , 222j connected to the three transistor EEPROM memory cells 206a, . . . , 206j, 207a, . . . , 207j, 208a, . . . , 208j, and 209a, . . . , 209j of the selected n Byte grouping 202a, . . . , 202i, and 204a, . . . , 204i. The source line driver 225 activates the source lines 226a, . . . , 226i connected to the three transistor EEPROM memory cells 206a, . . . , 206j, 207a, . . . , 207j, 208a, . . . , 208j, and 209a, . . . , 209j of the selected n Byte grouping 202a, . . . , 202i, and 204a, . . . , 204i.

The program and erasure of the three transistor EEPROM memory cells 206a, . . . , 206j, 207a, . . . , 207j, 208a, . . . , 208j, and 209a, . . . , 209j are accomplished as described in Table 8 above. The high voltage generator 230 is a circuit that is formed in an isolated triple well structure described in more detail hereinafter. The high voltage generator 230 generates the large positive programming voltage (+18V) and the large negative erasing voltage (−18V) that are applied through the n Byte word line decoder 215 to the word line 216a, . . . , 216i, and 217a, . . . , 217i. As noted above, the smallest increment for programming and erasure can thus be an n Byte grouping 202a, . . . , 202i, and 204a, . . . , 204i with the inhibit process as described above in Table 7.

The time for programming and erasing of an n Byte grouping 202a, ..., 202i, and 204a, ..., 204i is typically less than 5 mS and preferably approximately 2.5 ms reserved for erase and 2.5 ms for program. The time for programming and erasure of a full horizontal page 200a, ..., 200k is maintained less than the 5 ms due to a low Fowler Nordheim current of approximately ~10 pA per cell, in program and erase operations.

It would be understood by those skilled in the art that the two transistor EEPROM cell would be substituted for the three transistor EEPROM memory cells 206a, ..., 206j, 207a, ..., 207j, 208a, ..., 208j, and 209a, ..., 209j. The structure is essentially identical with the exception that the select gating transistors of the three transistor EEPROM memory cells 206a, ..., 206j, 207a, ..., 207j, 208a, ..., 208j, and 209a, ..., 209j are eliminated and consequently the select gate lines 212a, ..., 212k are also eliminated.

Figure 7:
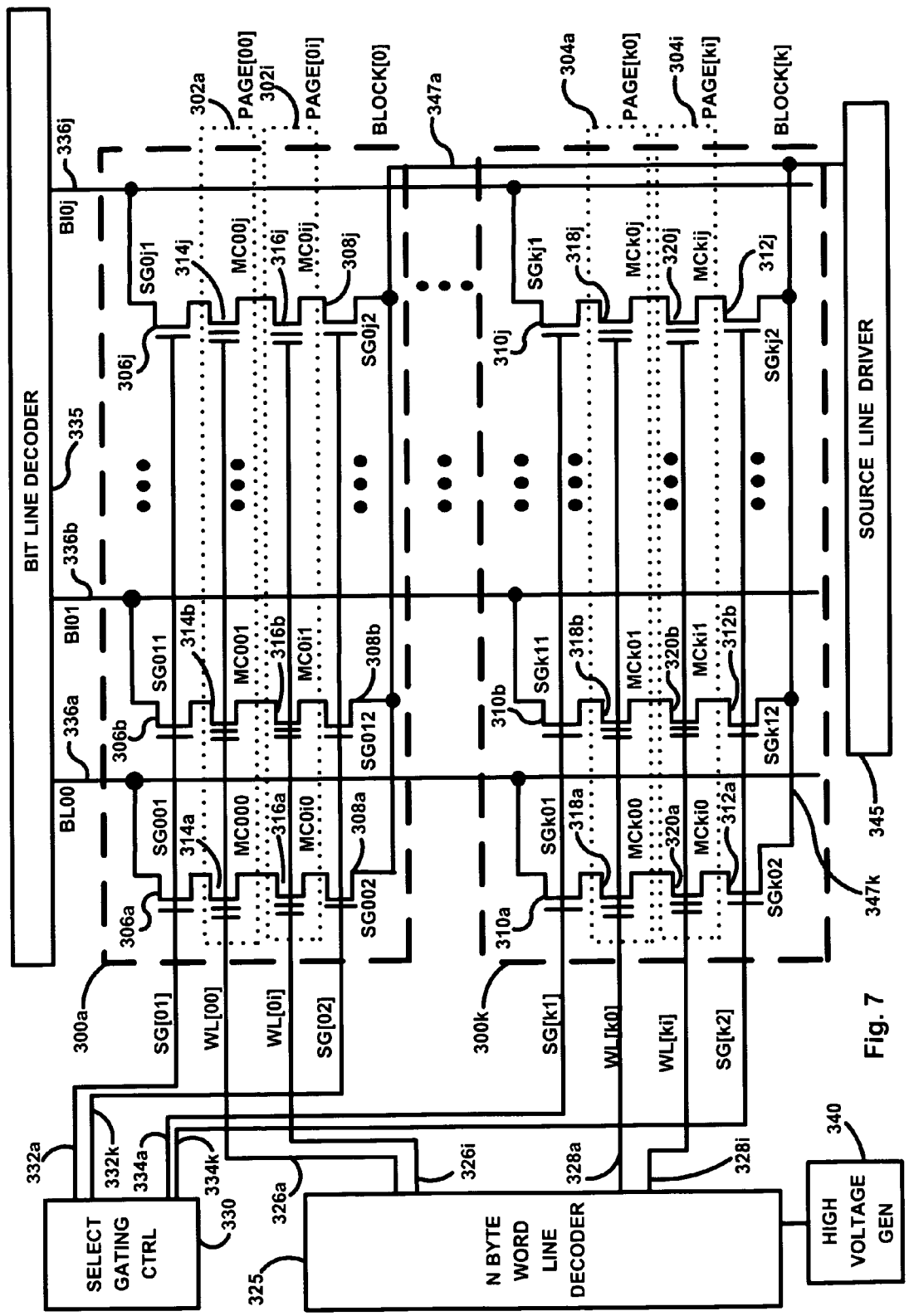
FIG. 7 is a schematic diagram of a block or sub-array of a NAND flash nonvolatile memory array of the present invention.

FIG. 7 illustrates a NAND-type flash nonvolatile memory array of the present invention organized by horizontal pages. The NAND-type flash nonvolatile memory array is constructed of blocks 300a, ..., 300k of pages 302a, ..., 302i, 304a, ..., 304i of serially connected memory cells 314a, ..., 314j, 316a, ..., 316j, 318a, ..., 318j, 320a, ..., 320j. Each horizontal page pages 302a, ..., 302i, 304a, ..., 304i is composed of a number of the serially connected memory cells 314a, ..., 314j, 316a, ..., 316j, 318a, ..., 318j, 320a, ..., 320j that are oriented in the X direction of the select gate lines 332a, ..., 332k and 334a, ..., 334k. The number of serially connected memory cells 314a, ..., 314j, 316a, ..., 316j, 318a, ..., 318j, 320a, ..., 320j on each page 302a, ..., 302i, 304a, ..., 304i may be any number dependent on the data requirements of the application.

The word line decoder 325 receives an address for the page 302a, ..., 302i, 304a, ..., 304i required to be transferred to or from the NAND-type flash nonvolatile memory array. The word line decoder 325 activates the appropriate word line 326a, ..., 326i, and 328a, ..., 328i to access the selected page pages 302a, ..., 302i, 304a, ..., 304i of the serially connected memory cells 314a, ..., 314j, 316a, ..., 316j, 318a, ..., 318j, 320a, ..., 320j.

The select gating controller 330 activates the select gate lines 332a, ..., 332k, 334a, ..., 334k to activate the gating transistors 306a, ..., 306j, 308a, ..., 308j, 310a, ..., 310j, 312a, ..., 312j to access the serially connected memory cells 314a, ..., 314j, 316a, ..., 316j, 318a, ..., 318j, 320a, ..., 320j of the selected page 302a, ..., 302i, 304a, ..., 304i. The Bit line decoder 335 activates the bit lines 336a, ..., 336j connected to the serially connected memory cells 314a, ..., 314j, 316a, ..., 316j, 318a, ..., 318j, 320a, ..., 320j. The source line driver 345 activates the source lines 347a, ..., 347k of the serially connected memory cells 314a, ..., 314j, 316a, ..., 316j, 318a, ..., 318j, 320a, ..., 320j.

The program and erasure of the serially connected memory cells 314a, ..., 314j, 316a, ..., 316j, 318a, ..., 318j, 320a, ..., 320j are accomplished as described in Table 5 above. The high voltage generator 340 is a circuit that is formed in an isolated triple well structure described in more detail hereinafter. The high voltage generator 340 generates the large positive programming voltage (+18V) and the large negative erasing voltage (−18V) that are applied through the word line decoder 325 to the word line 326a, ..., 326i, and 328a, ..., 328i. As noted above, the smallest increment for programming and erasure can thus be a page 302a, ..., 302i, 304a, ..., 304i of the serially connected memory cells 314a, ..., 314j, 316a, ..., 316j, 318a, ..., 318j, 320a, ..., 320j.

The program and erase operation of the NAND type flash memory array of this invention, may be for the whole NAND-type flash memory array, individual blocks 300a, ..., 300k, or individual pages 302a, ..., 302i, 304a, ..., 304i where the word lines 326a, ..., 326i, and 328a, ..., 328i of the array or selected blocks 300a, ..., 300k, or selected pages 302a, ..., 302i, 304a, ..., 304i are coupled to the large negative voltage (−18V) generated by the high voltage generator 340, all bit lines 336a, ..., 336k are coupled to ground and all select gate lines 332a, ..., 332k, 334a, ..., 334k are coupled to VDD and source lines 347a, ..., 342k are coupled to ground. With these proper voltages set up, the threshold voltage Vt of the selected serially connected memory cells 314a, ..., 314j, 316a, ..., 316j, 318a, 318j, 320a, ..., 320j in the NAND-type flash nonvolatile memory array will be decreased after erase with a predetermined erase time of 2–3 mS. And decreased after program with a predetermined program time 300 μS.

Figure 8:
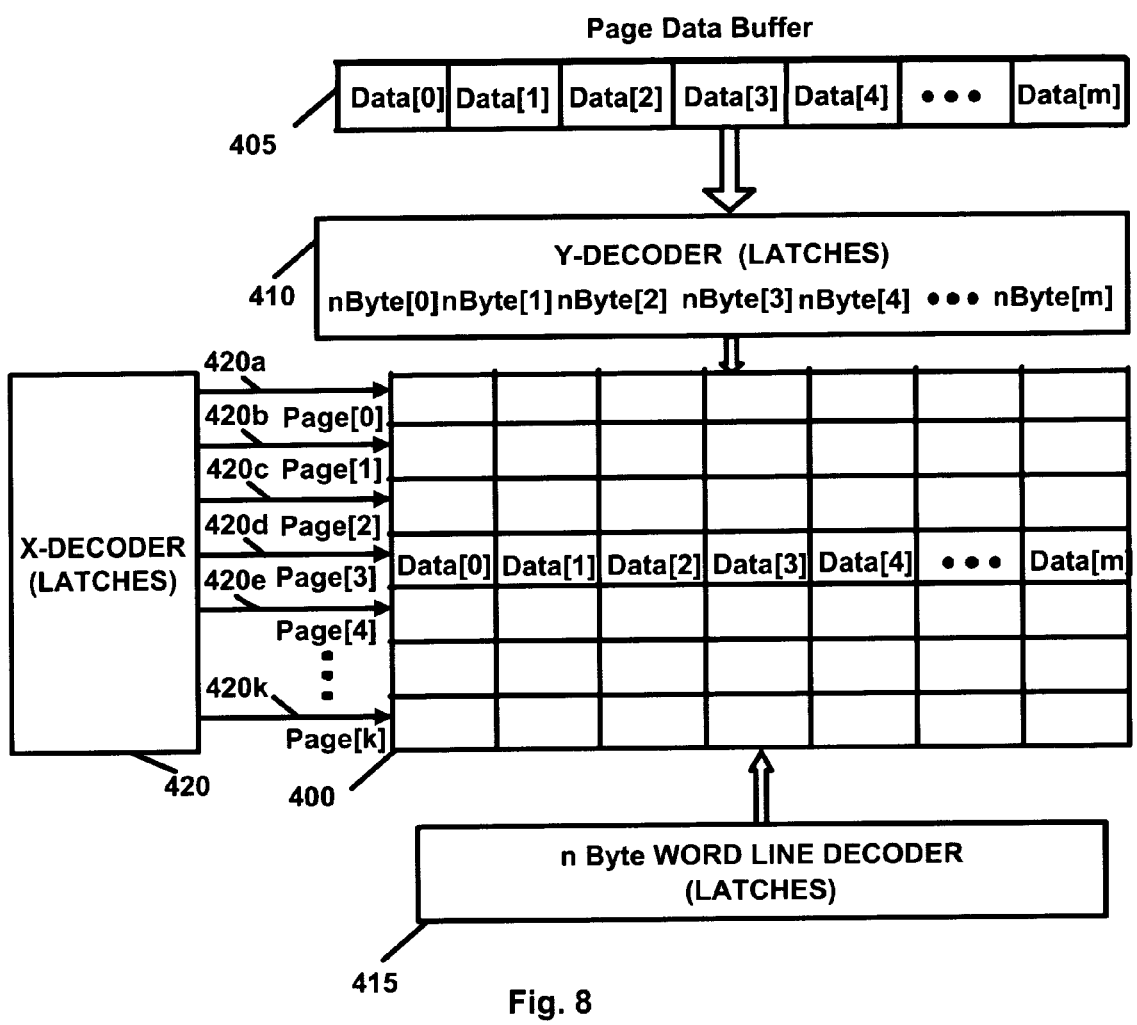
FIG. 8 is an architectural diagram of the decoding of the horizontal pages shown for both 2-transistor EEPROM and 3-transistor EEPROM of the present invention.

FIG. 8 is an architectural diagram of the decoding of the horizontal pages of a two-transistor EEPROM sub-array and three-transistor EEPROM of FIG. 6 of the present invention. The array 400 is divided into the n Byte groupings 202a, ..., 202i, and 204a, ..., 204i of FIG. 6 into which the n-Byte data (DATA[0], ..., DATA[m]) is stored. The n-Byte data (DATA[0], ..., DATA[m]) is transferred from external circuitry such as an embedded process or a smart card to a page data buffer 405. The address is transferred to X-decoder 420 which determines which of the page select lines 420a, ..., 420k are to be accessed. The X-decoder 420 acts as the select gating control 210 of FIG. 6 to activate the select gating transistors of the EEPROM memory cells. In the two transistor EEPROM cell there is one select gating line and in the three transistor EEPROM cell there are two select gating lines per page select line 420a, ..., 420k.

The Y-decoder 410 and n Byte-word line decoder 415 decode each address of the n Bytes to be accessed within each page. The Y-decoder activates the bit lines 221a, ..., 221j, 222a, ..., 222j of the EEPROM memory cells 206a, ..., 206j, 207a, ..., 207j, 208a, ..., 208j, and 209a, ..., 209j of FIG. 6 within the array 400. The n Byte word line decode 415 sets the word lines 216a, ..., 216i, and 217a, ..., 217i of FIG. 6 for the program and erasure of the n-Byte data (DATA[0], ..., DATA[m]).

The latches of X-decoders 420, byte-word decoders 415 and Y-decoders 410 are set to store the numbers of n bytes selected for self-timed write operation. Therefore, the data stored in the page data buffer can be written to the corresponding location of the bytes in the page. It should be noted that, for parallel erase operation, the X-decoder 420, Y-decoder 410, and byte-word line decoder 415 may contain latches circuitry to provide the multiple selection of the word lines and bit lines for multiple bytes.

Figure 9A:
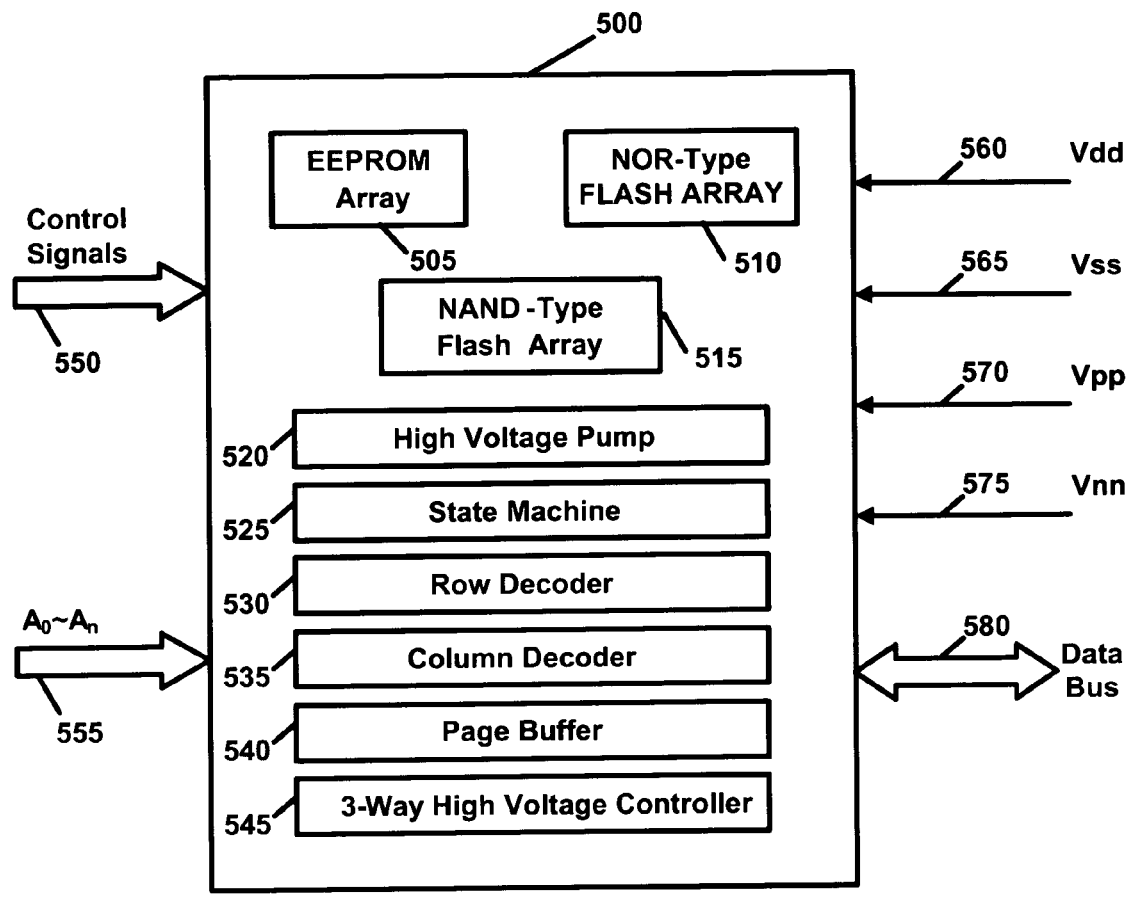
FIGS. 9a–e are block diagrams of embodiments of a combination nonvolatile memory non-volatile memory including one EEPROM (2-transistor or 3-transistor) array, one NOR-type Flash (one-transistor) array and one NAND-type (one-transistor) Flash array on an integrated circuit chip of the present invention.

A nonvolatile memory integrated circuit of the present invention is illustrated in FIG. 9a. The nonvolatile memory integrated circuit 500 includes multiple types of the EEPROM (2-transistor or 3-transistor) array 505, the NOR-type (one-transistor) Flash nonvolatile memory array 510 and then NAND-type (one-transistor) flash nonvolatile memory array 515 on an integrated circuit substrate of the present invention. Incorporated within the nonvolatile memory integrated circuit 500 is a high voltage charge pump 520 that develops the large positive programming voltage (+18V) for programming operation. A state machine 525 controls the flow of data and operations. The row decoder 530 and a column decoder 535 receive the address 555 from an external source, decode the address 555 to generate the necessary signals to activate the select gate transistors, selected word lines, and selected bit lines for reading, programming, and erasing the EEPROM (2-transistor or 3-transistor) array 505, the NOR-type (one-transistor) Flash nonvolatile memory array 510 and then NAND-type (one-transistor) flash nonvolatile memory array 515. A page buffer 540 stores the data for a read and programming operation of the selected the EEPROM (2-transistor or 3-transistor) array 505, the NOR-type (one-transistor) Flash nonvolatile memory array 510 and then NAND-type (one-transistor) flash nonvolatile memory array 515. A high voltage controller 545 is connected to receive the external high voltages programming voltage VPP 570 and external negative erasing voltage VNN 575 to be applied to the selected the EEPROM (2-transistor or 3-transistor) array 505, the NOR-type (one-transistor) Flash nonvolatile memory array 510 and then NAND-type (one-transistor) flash nonvolatile memory array 515. The control signals 550 are received by the state machine 525 to provide control signals such as OEB(output enable), CEB(chip enable). The bidirectional data bus, DO-Dm 580 is the signal path for the data read from and programmed to the EEPROM (2-transistor or 3-transistor) array 505, the NOR-type (one-transistor) Flash nonvolatile memory array 510 and then NAND-type (one-transistor) flash nonvolatile memory array 515. The Power supply voltage VDD is transferred through the terminal 560 and the ground or substrate reference voltage VSS is transferred through the terminal 565.

Figure 9B:
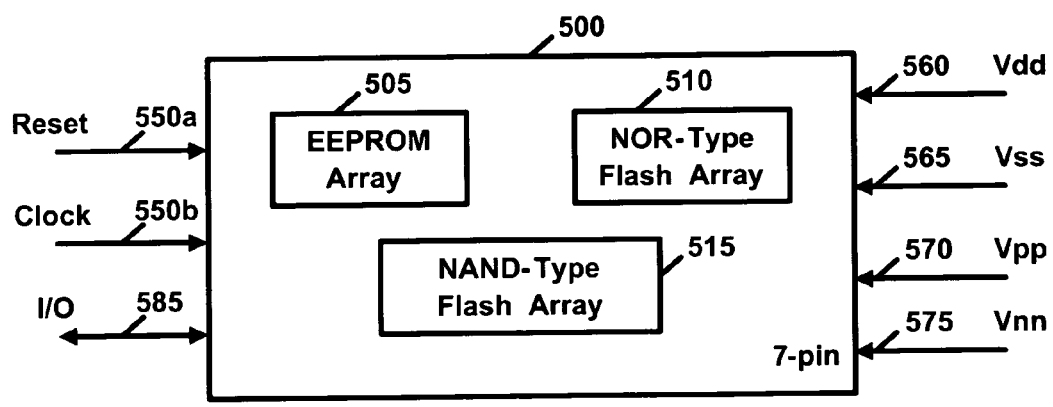
Figure 9C:
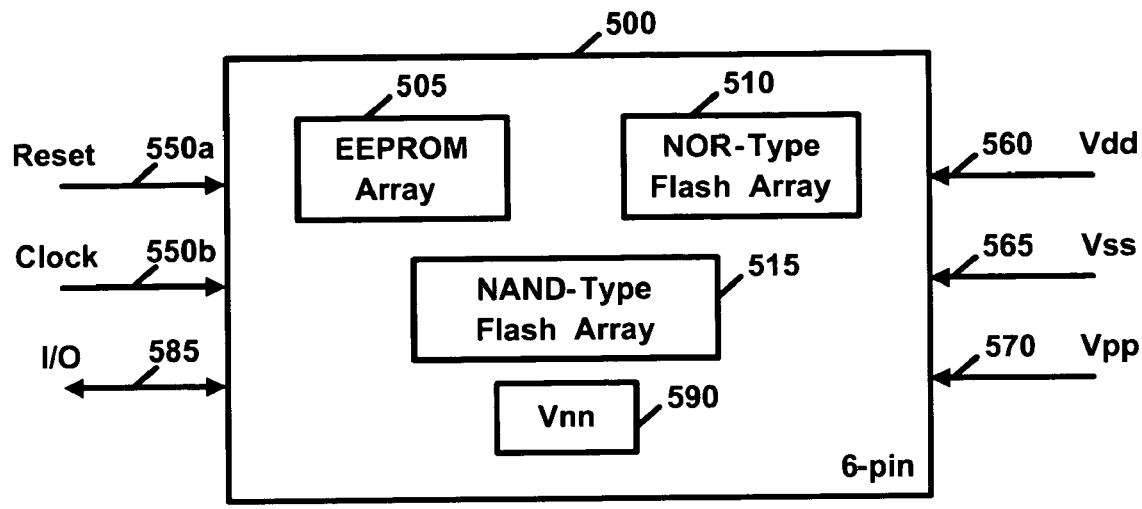
Figure 9D:
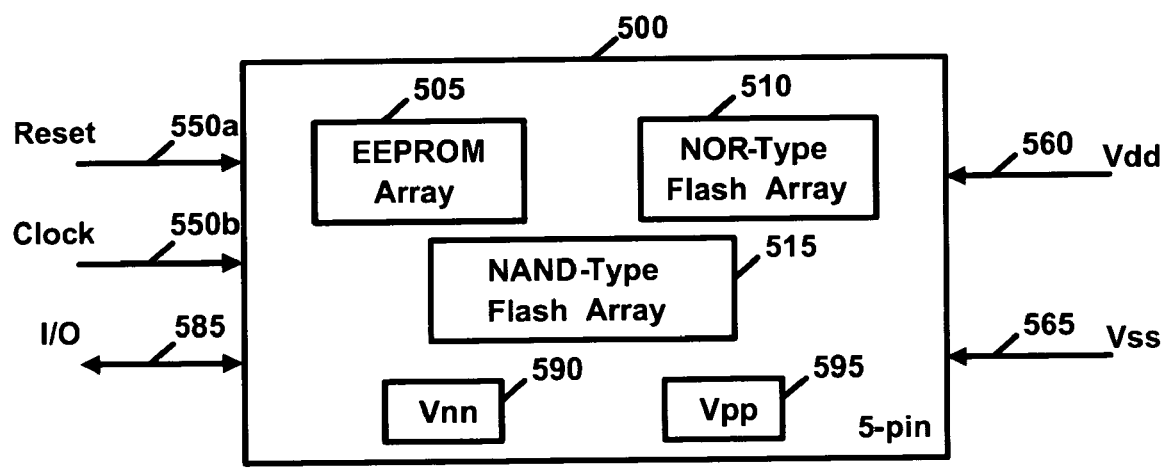

For SIM-card application, the input and output data becomes serial and requires less number of external pins. FIGS. 9b-9d illustrate other embodiments of the nonvolatile memory integrated circuit 500 of this invention. The nonvolatile memory integrated circuit 500 in FIG. 5b has the EEPROM (2-transistor or 3-transistor) array 505, the NOR-type (one-transistor) Flash nonvolatile memory array 510 and then NAND-type (one-transistor) flash nonvolatile memory array 515 with the control and support circuitry 520, 525, 530, 535, 540, and 545 of FIG. 9a, but with the data bus replaced with a serial I/O connection 585 that receives the address, data, and control in serialized messages. The controls are now simplified to a reset signal 550a and a clock timing signal 550b. The power supply voltage VDD and the ground or substrate reference VSS are similarly transferred respectively through terminals 560 and 565.

The external large positive programming voltage VPP and the large negative erasing voltage VNN for accelerated program and erase operation may be generated by an external voltage generator and transferred through the terminals 570 and 575. An alternative eliminates the terminal 575 and has an internal voltage generator 590 to generate the large negative erasing voltage VNN as shown in FIG. 9c. Both of the two external large positive programming voltage VPP and the large negative erasing voltage VNN for accelerated program and erase operation may be respectively generated by the internal generators 590 and 595 to eliminate the terminals 570 and 575 to create a five terminal nonvolatile memory integrated circuit of this invention, as shown in FIG. 9d.

Figure 9E:
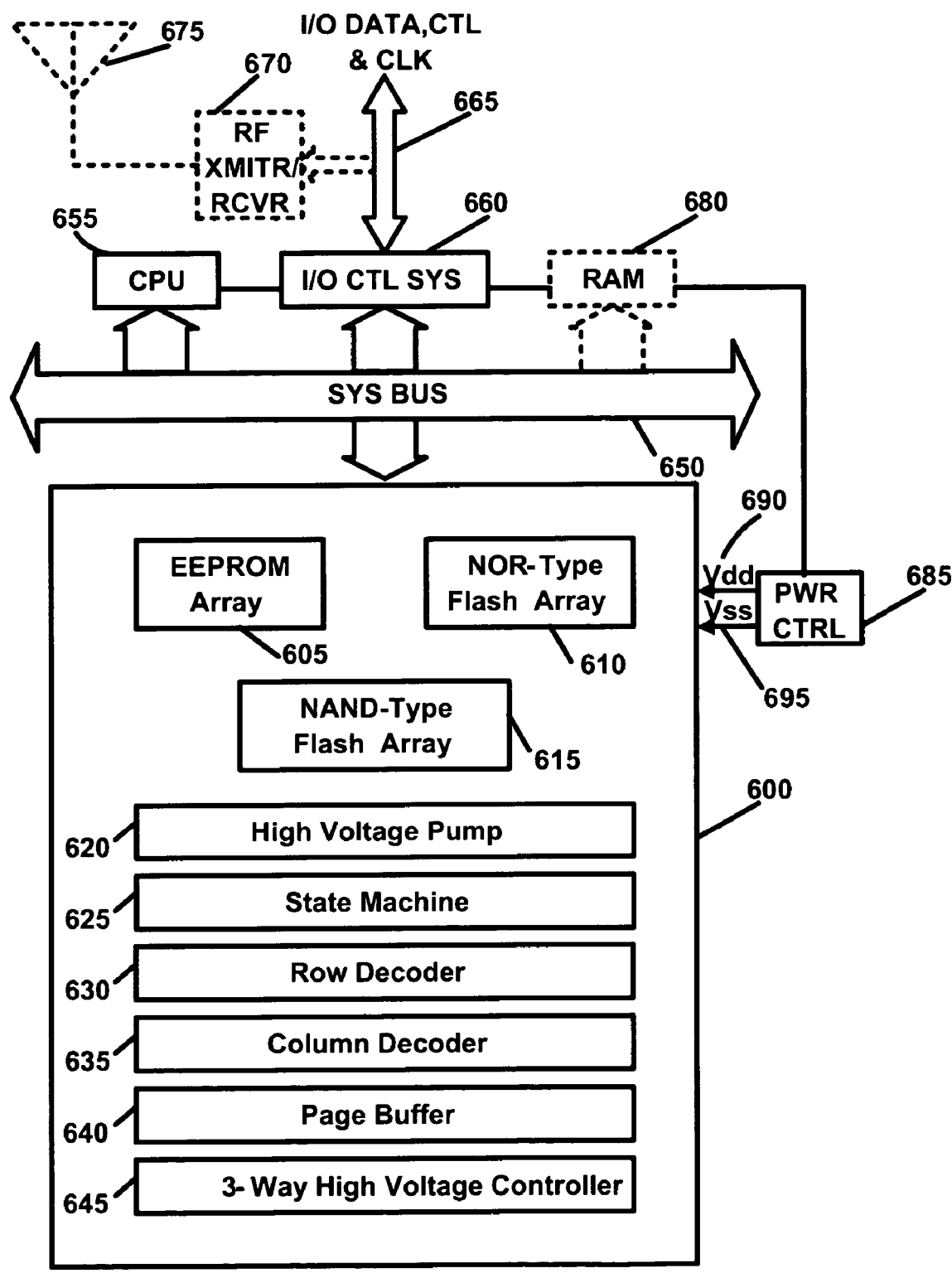

FIG. 9e shows the physical structure of an embedded processor system-on-a-chip integrating combination nonvolatile memory 600 the EEPROM (2-transistor or 3-transistor) array 605, the NOR-type (one-transistor) Flash nonvolatile memory array 610 and then NAND-type (one-transistor) flash nonvolatile memory array 615 of this invention Incorporated within the nonvolatile memory integrated circuit 600 is a high voltage charge pump 620 that develops the large positive programming voltage (−18V) for programming operation. A state machine 625 controls the flow of data, address, and operations to the system bus 650. The row decoder 630 and a column decoder 635 receive the address from the system bus 650, decode the address to generate the necessary signals to activate the select gate transistors, selected word lines, and selected bit lines for reading, programming, and erasing the EEPROM (2-transistor or 3-transistor) array 605, the NOR-type (one-transistor) Flash nonvolatile memory array 610 and then NAND-type (one-transistor) flash nonvolatile memory array 615. A page buffer 640 stores the data for a read and programming operation of the selected the EEPROM (2-transistor or 3-transistor) array 605, the NOR-type (one-transistor) Flash nonvolatile memory array 610 and then NAND-type (one-transistor) flash nonvolatile memory array 615. A high voltage controller 645 is connected to the high voltage charge pump 620 to receive the high voltages programming voltage VPP and negative erasing voltage VNN to be applied to the selected the EEPROM (2-transistor or 3-transistor) array 605, the NOR-type (one-transistor) Flash nonvolatile memory array 610 and then NAND-type (one-transistor) flash nonvolatile memory array 615.

The combination nonvolatile memory array 600 is connected to the system bus 650 which provides the control signals that are received by the state machine 625 to provide control signals such as OEB(output enable), CEB(chip enable). The system bus 650 also contains the bidirectional data bus that is the signal path for the data read from and programmed to the EEPROM (2-transistor or 3-transistor) array 605, the NOR-type (one-transistor) Flash nonvolatile memory array 610 and then NAND-type (one-transistor) flash nonvolatile memory array 615. Additionally, the system bus 650 has the address bus that details the location of the data that is to be read from and programmed to the EEPROM (2-transistor or 3-transistor) array 605, the NOR-type (one-transistor) Flash nonvolatile memory array 610 and then NAND-type (one-transistor) flash nonvolatile memory array 615. The power supply voltage VDD is transferred through the terminal 690 and the ground or substrate reference voltage VSS is transferred through the terminal 695 from the power control circuit 685. If the combination nonvolatile memory does not develop the large positive voltage programming voltage VPP or the large negative erasing voltage VNN in the high voltage pump 620, these voltages are generated in the power control circuit 685 and transferred to the combination nonvolatile memory 600 in a fashion similar to that described in FIG. 9b.

The smart card integrated system-on-a-chip has an embedded central processing unit 655 and an Input/Output controller 660 connected to the system bus 650. The Input/Output controller 660 receive external data and command signals from an Input/Output interface 665. The Input/Output interface 665 maybe a connector with terminals that communicate with external circuitry or may be a radio frequency (RF) transmitter/receiver 670 connected to an antenna 675 to wirelessly communicate with the external circuitry. Further, in RFID types of applications the power controller 685 may be connected to the RF receiver to receive a portion of the RF energy received from the external circuitry to convert the RF energy to the power supply voltage VDD, ground or substrate reference voltage VSS the large positive programming voltage (+18V), and the large negative erasing voltage (−18V). In certain applications, the smart card may optionally include small density (<10 KB) random access memory (RAM) 680 for retention of temporary data.

Figure 10:
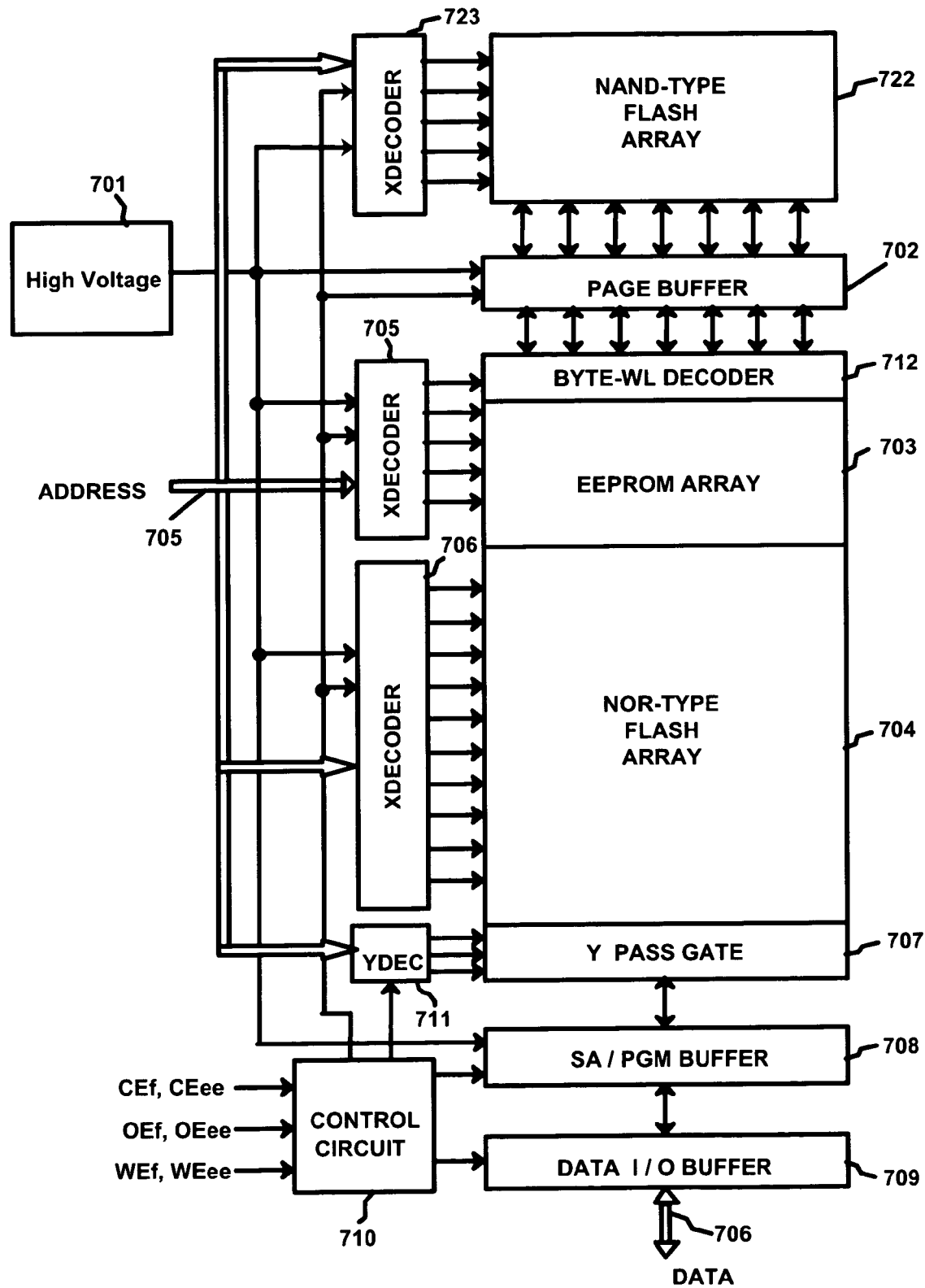
FIGS. 10 and 11 are schematic diagrams of embodiments of a combination EEPROM array, one-transistor NOR-type Flash array and one-transistor NAND-type Flash nonvolatile memory array on a nonvolatile memory integrated circuit chip of the present invention.

Refer now to FIG. 10 for an illustration of a combination nonvolatile memory of this invention including an EEPROM array 703, one-transistor NOR-type Flash nonvolatile memory array 704 and one-transistor NAND-type Flash nonvolatile memory array 722. The erase scheme of the one-transistor NAND Flash nonvolatile memory array 722 and the EEPROM 703 employ identical Fowler Nordheim-channel erase that results in a threshold voltage (Vt) decrease and similarly the program process uses the Fowler Nordheim channel program that increases the threshold voltage (Vt) of the memory cells. The NOR-type Flash nonvolatile memory cell 704 also uses the Fowler Nordheim channel erase. However, the Channel Hot Electron (CHE) process is used for programming. A first type of erase operation can be performed in units of page in the EEPROM array 703, the NOR-type Flash nonvolatile memory array 704 and the NAND-type Flash nonvolatile memory array 722. A type of second erase operation can be performed in units of blocks in NOR-type Flash nonvolatile memory array 704 and NAND-type Flash nonvolatile memory array 722 only. A third type of erase operation is performed in units of a whole memory array in the three arrays EEPROM array 703, NOR-type Flash nonvolatile memory array 704 and NAND-type Flash nonvolatile memory array 722.

A two transistor EEPROM array and a NOR-type Flash nonvolatile memory array 704 are programmed in units of bits such as 8 bits or 4 bits due to high CHE program current. But the program operation for a three transistor EEPROM array 703 and a NAND-type Flash nonvolatile memory array 722 is programmed in units of page because of the low Fowler Nordheim tunneling current. The three nonvolatile memory arrays 703, 704, and 722 share the same bit line and data line facilities, which include the Y-decoder 711, the Y-pass gates of the bit line select circuit 707, sense amplifiers and program buffers 708, Data I/O buffers 709 and high-voltage generator 701. Separate X-decoders 705, 706, and 723 are used respectively for the EEPROM array 703, NOR-type Flash nonvolatile memory array 704 and NAND-type Flash array 722.

The EEPROM array 703 (either two transistor or three transistor) and the NOR-type Flash nonvolatile memory array 704 and NAND-type Flash nonvolatile memory array 722 are stacked vertically so as to share bit lines connected through the Y pass gate of the bit line select circuit 707 to the sense amplifier and program buffer 708. Data is transferred to and from the sense amplifiers and program buffers 708 through the data I/O buffer 709. Addresses from external circuits are supplied to the X-decoders 705, 706 and 723 and the Y decoder 711 for addressing different word lines of the EEPROM array 703, NOR-type Flash nonvolatile memory array 704, and NAND-type Flash nonvolatile memory array 722 respectively. The Byte-word 712 decoder is dedicated for selecting byte-word of the EEPROM array 703.

The EEPROM array 703, NOR-type Flash nonvolatile memory array 704 and NAND-type Flash nonvolatile memory array 722 require on-chip high voltage charge pumps 701 for erase and program operations. A high voltage generator 701 connects the high voltages needed for erase and program operation to the page buffer 702, X-decoder 705, 706 and 723 and the sense amplifier and program buffer 708. The high voltage generator 701 is formed within a triple well one the surface of a substrate to isolate the high voltage generator 701 from other circuitry on the integrated circuit substrate. The triple well is formed by placing a deep N-type well in a P-type substrate and then forming a P-type well within the deep N-type well.

The high voltage generator 701 consists of several high voltage charge pumps. The first one is to generate +18V. The second one is to generate −18V. These two charge pumps are used for the floating-gates of NAND Flash nonvolatile memory cells, EEPROM cells and NOR Flash nonvolatile memory cells. A third charge pump is used to develop the relatively large programming voltage (+10V) used for the gates of NOR Flash cells. A fourth charge pump is for the intermediate level voltage of approximately +5V for the drains of NOR Flash nonvolatile memory cells. A conventional charge pump as is known in the art is formed of n-stage MOS diodes and capacitors. The MOS diode can be made of PMOS diode or NMOS diode. NMOS diode has better performance than PMOS diode in terms of small area due to no big N-well requirement and the stronger pump current due to bigger mobility. For NMOS diodes, there are two kinds of diodes. One is to generate the positive high-voltage that uses NMOS diode formed on P-substrate. The other is to generate the negative high-voltage that needs NMOS diode formed on triple well as described above of P-type well formed within an N-type well formed on the P-substrate. Without triple well NMOS diode, the negative high voltage has a short path to P-substrate, thus preventing generation of the large negative erasing voltage (−18V).

The page buffer 702 is connected to the byte-word decoder 712 to provide a byte wide data to a selected byte within a page. Since the EEPROM array 703, NOR-type Flash nonvolatile memory array 704 and NAND-type Flash nonvolatile memory array 722 can perform the erase in units of page, the page buffer 702 is shared by three nonvolatile memories 703, 704, and 722. The chip-enable CE and output-enable OE connected to the control circuitry 710 are assigned to the individual memory arrays to avoid data contention in read operation. Also connected to the control circuitry 710 is write-enable WE. Since an embedded CPU will not read data from the two different memories simultaneously, the address lines 705, and data lines 706 can be shared by the three nonvolatile memories 703, 704, and 722. The NOR-type Flash nonvolatile memory array 704 is normally used to store program code or data and is erased by page or block. The EEPROM array 703 is used for storing data in bytes that requires high-frequency change rates and NAND-type Flash nonvolatile memory array 722 is preferable to store the personalized data such as DNA, Iris, finger prints, palm prints and facial pictures for such smart card applications as an electronic passport (e-passport).

Figure 11:
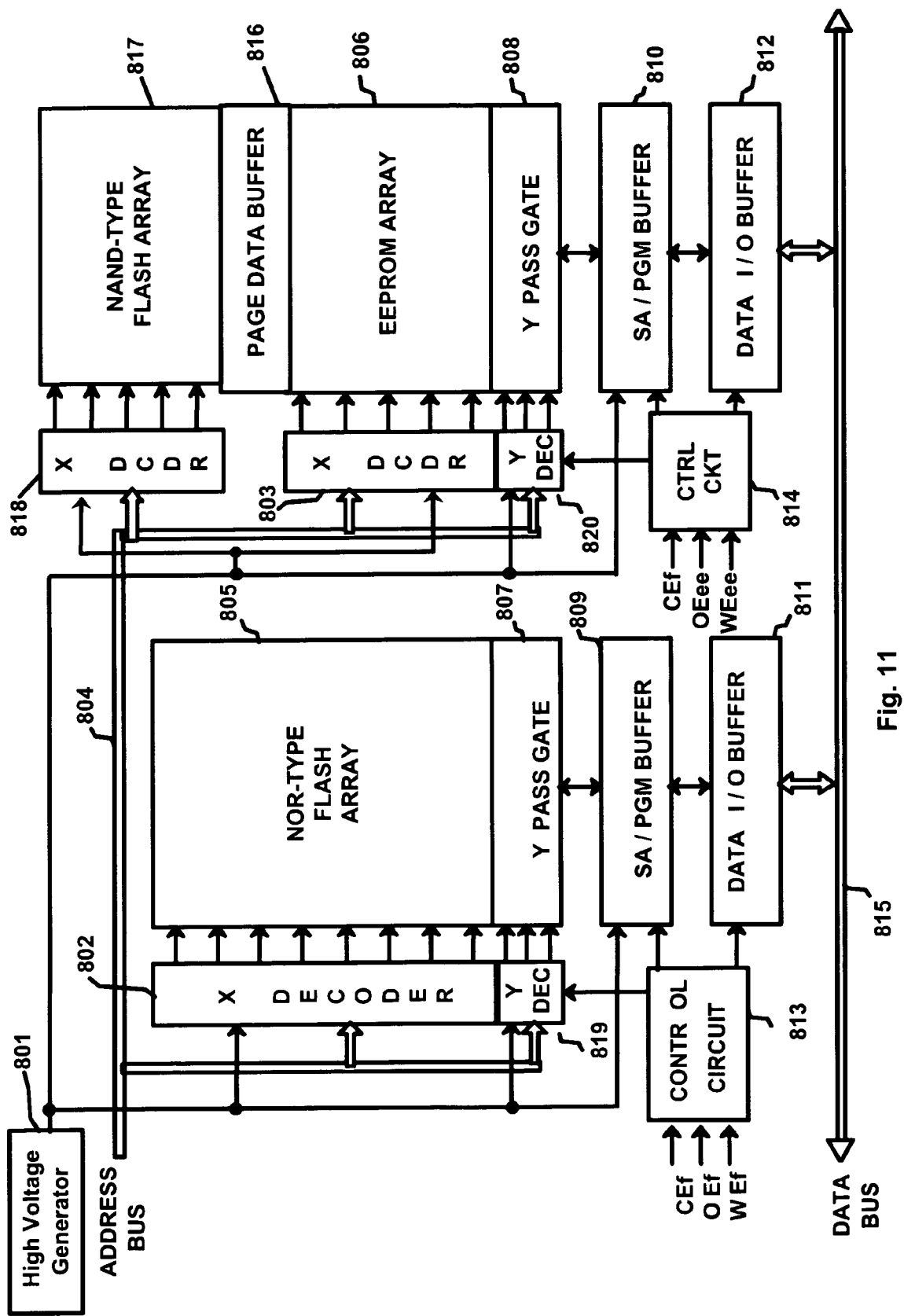

In FIG. 11 is shown another combination two or three transistor EEPROM array 806, NOR-type Flash nonvolatile memory array, 805 and NAND-type Flash nonvolatile memory array 817. In this implementation of the combinational nonvolatile memory integrated circuit of this invention is that the NOR Flash nonvolatile memory array 805 is physically and electrically separated from the combined arrays of NAND Flash nonvolatile memory array 817 and the EEPROM array 806

As described for FIG. 10, the erase scheme of the NAND Flash nonvolatile memory array 817 and EEPROM array 806 employ the identical Fowler Nordheim channel erase that results in a threshold voltage (Vt) decrease and the Fowler Nordheim channel programming that increases threshold voltage (Vt) of the memory cell. The NOR-type Flash nonvolatile memory array 805 uses the Fowler Nordheim channel erase while the channel hot electron (CHE) process is used for program. A first erase operation is performed in units of page in EEPROM array 806, the NOR-type Flash nonvolatile memory array 805, and NAND-type Flash nonvolatile memory array 817. A second erase operation is performed in units of blocks in NOR-type Flash nonvolatile memory array 805 and NAND-type Flash nonvolatile memory array 817 only. A third erase operation in performed in units of a whole array in all three of the EEPROM array 806, NOR-type Flash nonvolatile memory array 805, and NAND-type Flash nonvolatile memory array 817. The programming operation for a two transistor EEPROM array 806 and a NOR-type Flash nonvolatile memory array 805 is performed in units of bits such as 8 bits or 4 bits due to high channel hot electron (CHE) program current. But the program operation for a three transistor EEPROM array 806 and a NAND-type Flash nonvolatile memory array 817 is performed in units of page because of the low Fowler Nordheim tunneling current.

EEPROM array 806 and a NAND-type Flash nonvolatile memory array 817 share the same bit line and data line facilities, which include the Y-decoder 820, the Y-pass gates of bit line select circuitry 808, sense amplifiers and program buffers 810, and Data I/O buffers 812. The NOR-type Flash nonvolatile memory array 805 has separate bit line and data line facilities, which include the Y-decoder 819, the Y-pass gates of bit line select 807, sense amplifiers and program buffers 809, and Data I/O buffers 811. Each of the EEPROM array 806, the NAND-type Flash nonvolatile memory array 817, and the NOR-type Flash nonvolatile memory array 805 respectively have separate X-decoders 803, 818, and 802.

The EEPROM array 806 and the NAND-type Flash nonvolatile memory array 817 are stacked vertically to share bit lines connected through the Y pass gate of the bit select circuitry 808 to the sense amplifier and program buffer 810. Data is transferred to and from the sense amplifiers and program buffers through the data I/O buffer 812. Addresses are supplied to the X-decoders 818, 803 and 802 and the Y decoder 820 and 819 for addressing different word lines and bit lines of the NAND-type Flash nonvolatile memory array 817, the EEPROM array 806, and the NOR-type Flash nonvolatile memory array 805 respectively. The Byte-word decoder within the X decoder 803 is dedicated for selecting byte-word of the EEPROM memory 806.

The EEPROM array 806, the NAND-type Flash nonvolatile memory array 817, and the NOR-type Flash nonvolatile memory array 805 require on-chip high voltage charge pumps for erase and program operations. A high voltage generator 801 connects the high voltages needed for erase and program operation to the page buffer 816, X-decoder 802, 803 and 818 and the sense amplifier and program buffer 809 and 810. The page buffer 816 is connected to the byte-word decoder of the X-decoder 803 to provide a byte wide data to a selected byte within a page. Since the EEPROM array 806 and the NAND-type Flash nonvolatile memory array 817 can perform the erase in units of page, the page buffer 816 is shared by two NAND Flash and EEPROM memories.

The chip-enable CE and output-enable OE connected to the control circuitry 813 and 814 are assigned to the individual memory arrays to avoid data contention in read operation. Also connected to the control circuitry 813 and 814 is write-enable WE. Since an embedded CPU will not read data from the two different memories simultaneously, the address lines 804, and data lines bus 815 can be shared by the three nonvolatile memories 805, 806, and 817. The NOR-type Flash nonvolatile memory array 805 is used to store program code or data and is erased by page or block. The EEPROM array 806 is used for storing data in bytes that requires high-frequency change rates and NAND-type Flash nonvolatile memory array 817 is preferable to store the personalized data such as DNA, Iris, finger prints, palm prints and facial pictures for such smart applications as an electronic passport (e-passport).

Figure 12:
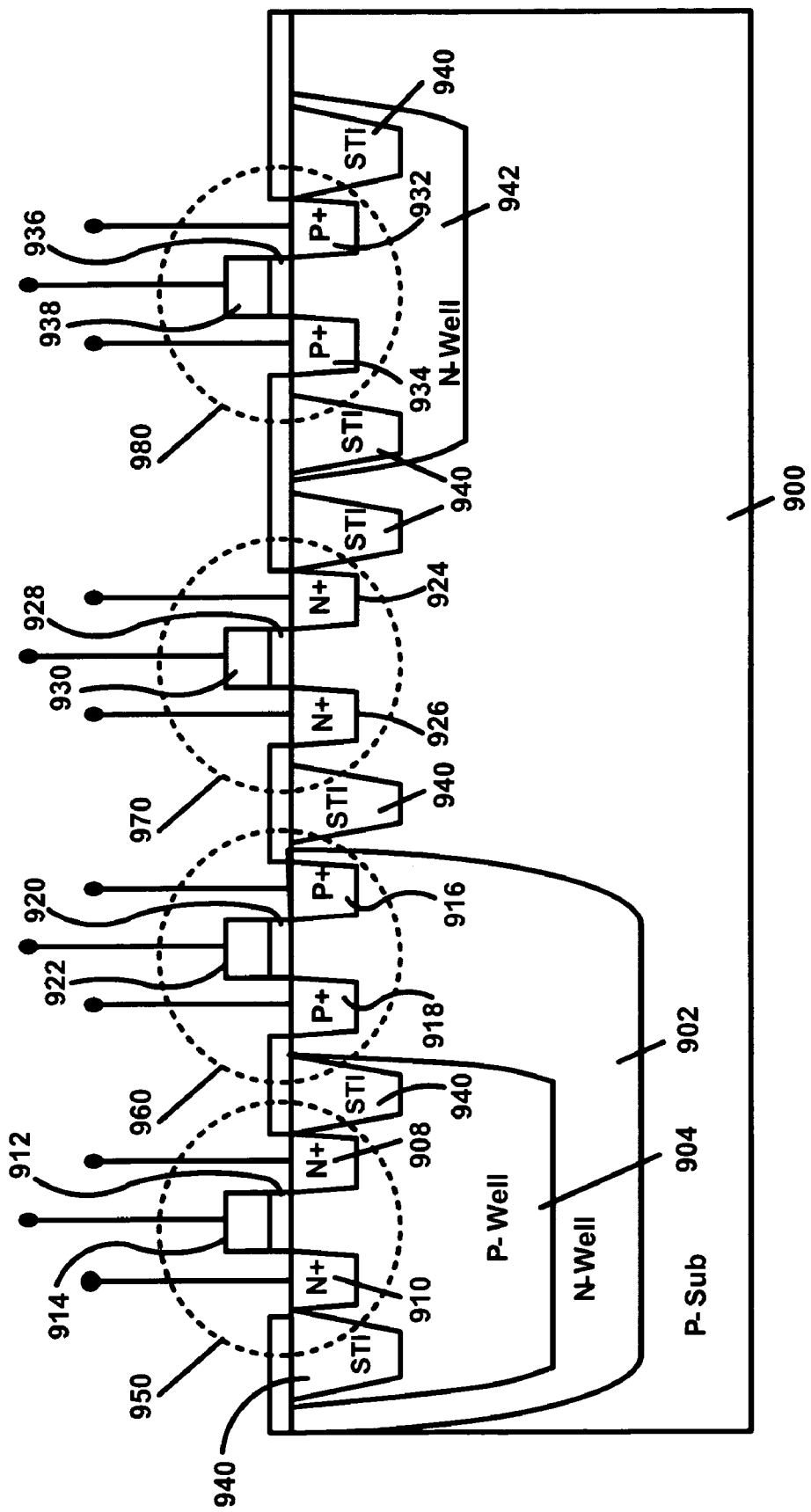
FIG. 12 is a cross sectional view of a nonvolatile memory integrated circuit of this invention illustrating a triple well structure of the present invention.

Refer now to FIG. 12 for a discussion of the structure of a substrate 900 on to which a combination of nonvolatile memories of this invention is formed. The EEPROM array, the NAND-type Flash nonvolatile memory array, and the NOR-type Flash nonvolatile memory array combination may be formed directly on the P-type substrate 900 or within a triple well structure. The triple well structure is formed of a N-type deep well deeply diffused into the surface of the P-type substrate 900. A P-type well 904 is formed within the N-type deep well 902 The N-type MOS transistor 950 is formed within the P-type well 904.

If the N-type MOS transistor 950 is to be a nonvolatile memory cell, it will be formed as describe in FIGS. 1b–1d, 3b–3c, and 4b–4c for the floating gate transistors. The select gating transistor for the memory array is formed of with the drain 908 and source 910 being diffused into the P-type well 904. The gate oxide 912 is placed on the surface of the substrate 900 over the P-type well 904 between the drain 908 and the source 910. The gate 914 is formed on the gate oxide 912. If the MOS transistor 950 must withstand the large positive programming voltage (+18V), the large negative erasing voltage (−18V), or the relatively large programming voltage (+10V), the gate oxide 912 is made thicker to prevent electrical breakdown of the gate oxide 912.

If a P-type MOS transistor 960 is required in conjunction with the N-type MOS transistor 950, it is formed within the surface boundaries of the N-type deep well 902. The drain 916 and the source 918 are formed of P-type material diffused into the surface of the N-type deep well 902. The gate oxide 920 is formed on the surface of the N-type deep well with the gate 922 formed on the gate oxide 920.

The N-type MOS transistor 970 is formed within the P-type substrate 900. If the N-type MOS transistor 970 is to be a nonvolatile memory cell, it will be formed as describe in FIGS. 1b–1d, 3b–3c, and 4b–4c for the floating gate memory. The select gate for the memory array is formed of with the drain 924 and source 926 being diffused into the P-type substrate 900. The gate oxide 928 is placed on the surface of the substrate 900 between the drain 924 and the source 926. The gate 930 is formed on the gate oxide 928. If the MOS transistor 970 must withstand the large positive programming voltage (+18V), the large negative erasing voltage (−18V), or the relatively large programming voltage (+10V), the gate oxide 928 is made thicker to prevent electrical breakdown of the gate oxide 928.

If a P-type MOS transistor 980 is required in conjunction with the N-type MOS transistor 970, it is formed within the surface boundaries of the N-type well 942. The N-type well 942 is diffused into the surface of the P-type substrate 900. The drain 932 and the source 934 are formed of P-type material diffused into the surface of the N-type well 942. The gate oxide 936 is formed on the surface of the N-type well 942 with the gate 938 formed on the gate oxide 936.

The shallow trench isolation 940 is placed between the MOS transistors 950, 960, 970, and 980 to prevent interaction between the devices in operation. Further, the N-type deep well 902, the P-type well 904, and the N-type well 942 are biased appropriately to prevent current flow between the wells to provide more electrical isolation.

In SIM-card and smart-card applications, three nonvolatile memories are integrated on one monolithic integrated circuit substrate with a unified technology. CPU program and many application down-loadable programs are stored in NOR-type Flash nonvolatile memory array to allow high-speed read. The personalized biometric data is stored in NAND-type Flash nonvolatile memory array which typically allows for slow read speed but require the density as high as possible for superior security reason. EEPROM arrays is used to store byte-alterable data such as telephone books, emails and small data.

In regular SIM-card or smart-card applications, there are only five external pins. The data is serially clocked into or read from chip. But in order to successfully down load the serial data to a targeted memory of this combination nonvolatile, a data traffic controller directs the data to the appropriate memory location and memory type. A typical data traffic controller is a three-way multiplexer controlled by two control signals with the address for each nonvolatile memory type being designated as a binary number. For instance, 00 is used to select the NOR-type Flash nonvolatile memory array, 01 is to select the NAND-type Flash nonvolatile memory array and 10 is used to select two or three transistor EEPROM. In this instance the binary 11 becomes "don't care" and can be assigned for any other purpose.

The serial data input is shared by the three nonvolatile memories. If application data is received at the serial data input, the application data is serially clocked into an on-chip page buffer on bit-by-bit basis for programming a selected nonvolatile memory. If the serial data is for program and command, it should be clocked into an instruction register or command register. The command register will decode the serial data and output an instruction to control three-way multiplexer to forward the application data to the selected nonvolatile.

While this invention has been particularly shown and described with reference to the preferred embodiments thereof, it will be understood by those skilled in the art that various changes in form and details may be made without departing from the spirit and scope of the invention.

The invention claimed is:

1. A nonvolatile memory integrated circuit placed on a substrate comprising
    a plurality of a nonvolatile memory arrays placed on said substrate;
    a memory control circuit in communication with external circuitry to receive address, command, and data signals, to interpret said address, command, and data signals, and in communication with said plurality of nonvolatile memory arrays to transfer said address, command and data signals for programming, reading, and erasing said nonvolatile memory arrays; and
    a voltage generator that generates a very large positive programming voltage and a very large negative erasing voltage and is in communication with said nonvolatile memory arrays to transfer said very large positive programming voltage to selected first sub-arrays of said nonvolatile memory arrays for programming said selected first sub-arrays and to transfer said very large negative erasing voltage to selected second sub-arrays of said nonvolatile memory arrays for erasing said selected second sub-arrays;
    wherein said voltage generator further generates a power supply voltage, a first moderately high positive program voltage, a second moderately high positive program voltage, an intermediate positive program voltage, and a ground reference voltage.

2. The nonvolatile memory integrated circuit of claim 1 wherein each of the plurality of the nonvolatile memory arrays are selected from the group of nonvolatile memories consisting of NOR configured flash memory, NAND configured flash memory, a two transistor electrically erasable programmable read only memories, and a three transistor electrically erasable programmable read only memories.

3. The nonvolatile memory integrated circuit of claim 1 wherein one of said nonvolatile memory arrays is the NOR configured flash memory and programming the selected first sub-arrays by setting at least one bit line of said selected first sub-arrays to the intermediate positive program voltage, at least one word line of said selected first sub-arrays to the first moderately high positive program voltage, at least one source line of said selected first sub-arrays to the ground reference voltage, at least one select gate of said selected first sub-arrays to the very large positive programming voltage, and a bulk region of all cells of said selected first sub-array to the ground reference voltage.

4. The nonvolatile memory integrated circuit of claim 1 wherein one of said nonvolatile memory arrays is the NAND configured flash memory and programming the selected first sub-arrays by setting at least one bit line of said selected first sub-arrays to the second moderately high positive program voltage, at least one word line of said selected first sub-arrays to the very large positive programming voltage, at least one source line of said selected first sub-arrays to the second moderately high positive program voltage, and a bulk region of all cells of said selected first sub-array to the ground reference voltage.

5. The nonvolatile memory integrated circuit of claim 1 wherein one of said nonvolatile memory arrays is the two transistor electrically erasable programmable read only memories and cells of said selected sub-array not programmed but have the word line at the moderately high positive program voltage are inhibited from programming by setting select gates of non-selected cells of said selected sub-arrays to the very large positive programming voltage.

6. The nonvolatile memory integrated circuit of claim 1 wherein one of said nonvolatile memory arrays is the three transistor electrically erasable programmable read only memories and programming the selected first sub-arrays by setting at least one bit line of said selected first sub-arrays to the ground reference, at least one first select gate line of said selected sub-arrays to the power supply voltage, at least one word line of said selected first sub-arrays to the very large positive programming voltage, at least one source line of said selected first sub-arrays to the ground reference voltage, and a bulk region of all cells of said selected first sub-array to the ground reference voltage.

7. The nonvolatile memory integrated circuit of claim 6 wherein those cells of said selected first sub-arrays not programmed but have the word line at the very large positive programming voltage are inhibited from programming by setting bit lines of non-selected cells of said selected sub-arrays to the power supply voltage.

8. The nonvolatile memory integrated circuit of claim 1 wherein one of said nonvolatile memory arrays is the NOR configured flash memory and erasing the selected second sub-arrays by setting at least one word line of said selected second sub-arrays to the very large negative erasing voltage, very large negative erasing voltage, at least one source line of said selected second sub-arrays, and a bulk region of all cells of said selected second sub-array to the ground reference voltage.

9. The nonvolatile memory integrated circuit of claim 1 wherein one of said nonvolatile memory arrays is the NAND configured flash memory and erasing the selected second sub-arrays by setting at least one word line of said selected second sub-arrays to the very large negative erasing voltage, very large negative erasing voltage, at least one source line of said selected second sub-arrays, and a bulk region of all cells of said selected second sub-array to the ground reference voltage.

10. The nonvolatile memory integrated circuit of claim 1 wherein one of said nonvolatile memory arrays is the two transistor electrically erasable programmable read only memories and erasing the selected second sub-arrays by setting at least one select gate line of said selected sub-arrays to the power supply voltage, at least one word line of said selected second sub-arrays to the very large negative erasing voltage, at least one bit line of said selected second sub-arrays, at least one source line of said selected second sub-arrays, and a bulk region of all cells of said selected second sub-array to the ground reference voltage.

11. The nonvolatile memory integrated circuit of claim 1 wherein one of said nonvolatile memory arrays is the three transistor electrically erasable programmable read only memories and erasing the selected second sub-arrays by setting at least one first select gate line and second select gate line of said selected sub-arrays to the power supply voltage, at least one word line of said selected second sub-arrays to the very large negative erasing voltage, at least one bit line of said selected second sub-arrays, at least one source line of said selected second sub-arrays, and a bulk region of all cells of said selected second sub-array to the ground reference voltage.

12. The nonvolatile memory integrated circuit of claim 1 further comprising a first triple well structure formed on said substrate and containing said voltage generator, wherein the first triple well structure comprises:
 a deep well of a first conductivity type formed within said substrate; and
 a shallower well of a second conductivity type formed within said deep well of the first conductivity type.

13. The nonvolatile memory integrated circuit of claim 1 further comprising a second triple well structure formed on said substrate and containing at least one of said nonvolatile memory arrays, wherein said second triple well structure comprises:
 a deep well of the first conductivity type formed within said substrate; and
 a shallower well of the second conductivity type formed within said deep well of the first conductivity type.

14. A smart card for securely providing, receiving, and processing secure digital data, said smart card comprising:
 a nonvolatile memory integrated circuit placed on a substrate comprising
 a plurality of a nonvolatile memory arrays placed on said substrate;
 a memory control circuit in communication with external circuitry to receive address, command, and data signals, to interpret said address, command, and data signals, and in communication with said plurality of nonvolatile memory arrays to transfer said address, command and data signals for programming, reading, and erasing said nonvolatile memory arrays; and
 a voltage generator that generates a very large positive programming voltage and a very large negative erasing voltage and is in communication with said nonvolatile memory arrays to transfer said very large positive programming voltage to selected first sub-arrays of said nonvolatile memory arrays for programming said selected first sub-arrays and to transfer said very large negative erasing voltage to selected second sub-arrays of said nonvolatile memory arrays for erasing said selected second sub-arrays;

wherein said voltage generator further generates a power supply voltage, a first moderately high positive program voltage, a second moderately high positive program voltage, an intermediate positive program voltage, and a ground reference voltage.

15. The smart card of claim 14 wherein each of the plurality of the nonvolatile memory arrays are selected from the group of nonvolatile memories consisting of NOR configured flash memory, NAND configured flash memory, a two transistor electrically erasable programmable read only memories, and a three transistor electrically erasable programmable read only memories.

16. The smart card of claim 14 wherein one of said nonvolatile memory arrays is the NOR configured flash memory and programming the selected first sub-arrays by setting at least one bit line of said selected first sub-arrays to the intermediate positive program voltage, at least one word line of said selected first sub-arrays to the first moderately high positive program voltage, at least one source line of said selected first sub-arrays to the ground reference voltage, at least one select gate of said selected first sub-arrays to the very large positive programming voltage, and a bulk region of all cells of said selected first sub-array to the ground reference voltage.

17. The smart card of claim 14 wherein one of said nonvolatile memory arrays is the NAND configured flash memory and programming the selected first sub-arrays by setting at least one bit line of said selected first sub-arrays to the second moderately high positive program voltage, at least one word line of said selected first sub-arrays to the very large positive programming voltage, at least one source line of said selected first sub-arrays to the second moderately high positive program voltage, and a bulk region of all cells of said selected first sub-array to the ground reference voltage.

18. The smart card of claim 14 wherein one of said nonvolatile memory arrays is the two transistor electrically erasable programmable read only memories and cells of said selected sub-array not programmed but have the word line at the moderately high positive program voltage are inhibited from programming by setting select gates of non-selected cells of said selected sub-arrays to the very large positive programming voltage.

19. The smart card of claim 14 wherein one of said nonvolatile memory arrays is the three transistor electrically erasable programmable read only memories and programming the selected first sub-arrays by setting at least one bit line of said selected first sub-arrays to the ground reference, at least one first select gate line of said selected sub-arrays to the power supply voltage, at least one word line of said selected first sub-arrays to the very large positive programming voltage, at least one source line of said selected first sub-arrays to the ground reference voltage, and a bulk region of all cells of said selected first sub-array to the ground reference voltage.

20. The smart card of claim 14 wherein the nonvolatile memory integrated circuit wherein those cells of said selected first sub-arrays not programmed but have the word line at the very large positive programming voltage are inhibited from programming by setting bit lines of non-selected cells of said selected sub-arrays to the power supply voltage.

21. The smart card of claim 14 wherein one of said nonvolatile memory arrays is the NOR configured flash memory and erasing the selected second sub-arrays by setting at least one word line of said selected second sub-arrays to the very large negative erasing voltage, very large negative erasing voltage, at least one source line of said selected second sub-arrays, and a bulk region of all cells of said selected second sub-array to the ground reference voltage.

22. The smart card of claim 14 wherein one of said nonvolatile memory arrays is the NAND configured flash memory and erasing the selected second sub-arrays by setting at least one word line of said selected second sub-arrays to the very large negative erasing voltage, very large negative erasing voltage, at least one source line of said selected second sub-arrays, and a bulk region of all cells of said selected second sub-array to the ground reference voltage.

23. The smart card of claim 14 wherein one of said nonvolatile memory arrays is the two transistor electrically erasable programmable read only memories and erasing the selected second sub-arrays by setting at least one select gate line of said selected sub-arrays to the power supply voltage, at least one word line of said selected second sub-arrays to the very large negative erasing voltage, at least one bit line of said selected second sub-arrays, at least one source line of said selected second sub-arrays, and a bulk region of all cells of said selected second sub-array to the ground reference voltage.

24. The smart card of claim 14 wherein one of said nonvolatile memory arrays is the three transistor electrically erasable programmable read only memories and erasing the selected second sub-arrays by setting at least one first select gate line and second select gate line of said selected sub-arrays to the power supply voltage, at least one word line of said selected second sub-arrays to the very large negative erasing voltage, at least one bit line of said selected second sub-arrays, at least one source line of said selected second sub-arrays, and a bulk region of all cells of said selected second sub-array to the ground reference voltage.

25. The smart card of claim 14 wherein the nonvolatile memory integrated circuit further comprises a first triple well structure formed on said substrate and containing said voltage generator, wherein the first triple well structure comprises:
   a deep well of a first conductivity type formed within said substrate; and
   a shallower well of a second conductivity type formed within said deep well of the first conductivity type.

26. The smart card of claim 14 wherein the nonvolatile memory integrated circuit further comprises a second triple well structure formed on said substrate and containing at least one of said nonvolatile memory arrays, wherein second triple well structure comprises:
   a deep well of the first conductivity type formed within said substrate; and
   a shallower well of the second conductivity type formed within said deep well of the first conductivity type.

* * * * *